United States Patent
Uedaira

(10) Patent No.: US 11,862,740 B2
(45) Date of Patent: Jan. 2, 2024

(54) ILLUMINANCE SENSOR, ELECTRONIC MACHINE AND 2D IMAGE SENSOR

(71) Applicant: ROHM Co., Ltd., Kyoto (JP)

(72) Inventor: Yoshitsugu Uedaira, Kyoto (JP)

(73) Assignee: ROHM CO., LTD., Kyoto (JP)

( * ) Notice: Subject to any disclaimer, the term of this patent is extended or adjusted under 35 U.S.C. 154(b) by 0 days.

(21) Appl. No.: 18/066,823

(22) Filed: Dec. 15, 2022

(65) Prior Publication Data
US 2023/0122157 A1  Apr. 20, 2023

Related U.S. Application Data

(62) Division of application No. 16/867,459, filed on May 5, 2020, now Pat. No. 11,563,131.

(30) Foreign Application Priority Data

May 9, 2019 (JP) .................................. 2019-088809
Feb. 21, 2020 (JP) .................................. 2020-028443

(51) Int. Cl.
*H01L 31/0232* (2014.01)
*H10K 59/65* (2023.01)
(Continued)

(52) U.S. Cl.
CPC ...... *H01L 31/02327* (2013.01); *G01J 1/0429* (2013.01); *G01J 1/1626* (2013.01);
(Continued)

(58) Field of Classification Search
CPC ......... H01L 27/14621; H01L 27/14625; H01L 31/02162; H01L 31/02327; H01L 31/09;
(Continued)

(56) References Cited

U.S. PATENT DOCUMENTS

2005/0030447 A1  2/2005  Hsu et al.
2017/0284789 A1  10/2017  Nishiwaki et al.
2018/0357462 A1*  12/2018  Mackey .............. G02F 1/13338

FOREIGN PATENT DOCUMENTS

JP  2012104656 A  5/2012

OTHER PUBLICATIONS

Office Action dated Jul. 25, 2023 issued by the Japan Patent Office for Japanese Application JP 2020-028443 with machine translation.
(Continued)

*Primary Examiner* — Herve-Louis Y Assouman
*Assistant Examiner* — Christopher M Roland
(74) *Attorney, Agent, or Firm* — HAMRE, SCHUMANN, MUELLER & LARSON, P.C.

(57) ABSTRACT

In an illuminance sensor, a slow axis of a first portion comprises a relation of +45° or −45° in regard to a first polarization direction that is a polarization direction of the a linear polarization plate, a relation of a slow axis of a second portion in regard to the first polarization direction is −45° or +45° that is opposite in sign to the relation of the slow axis of the first portion in regard to the first polarization direction, and a slow axis of a second quarter-wave plate comprises a relation of +45° or −45° in regard to a second polarization direction that is a polarization direction of a second linear polarization plate, wherein the relation of the slow axis of the second quarter-wave plate in regard to the second polarization direction is the same with the relation of the slow axis of the first portion in regard to the first polarization direction.

7 Claims, 11 Drawing Sheets

(51) Int. Cl.
| | |
|---|---|
| *H10K 50/86* | (2023.01) |
| *G02B 5/20* | (2006.01) |
| *H01L 27/146* | (2006.01) |
| *H01L 31/09* | (2006.01) |
| *G02B 27/28* | (2006.01) |
| *H10K 59/60* | (2023.01) |
| *H01L 31/0216* | (2014.01) |
| *H01L 31/101* | (2006.01) |
| *G01J 1/16* | (2006.01) |
| *G01J 1/04* | (2006.01) |

(52) U.S. Cl.
CPC ............. *G02B 5/201* (2013.01); *G02B 5/208* (2013.01); *G02B 27/286* (2013.01); *H01L 27/14621* (2013.01); *H01L 27/14625* (2013.01); *H01L 31/02162* (2013.01); *H01L 31/09* (2013.01); *H01L 31/101* (2013.01); *H10K 50/86* (2023.02); *H10K 59/60* (2023.02); *H10K 59/65* (2023.02)

(58) Field of Classification Search
CPC ...... H01L 31/101; H10K 50/86; H10K 59/60; H10K 59/65; G02B 5/201; G02B 5/208; G02B 27/286; G01J 1/0429; G01J 1/1626
See application file for complete search history.

(56) References Cited

OTHER PUBLICATIONS

Search report dated Jul. 25, 2023 issued by the Japan Patent Office for Japanese Application JP 2020-028443 with machine translation.

\* cited by examiner

ILLUMINANCE SENSOR, ELECTRONIC MACHINE AND 2D IMAGE SENSOR

PRIORITY CLAIM AND CROSS-REFERENCE

This application is a divisional application claiming priority to U.S. non-provisional application Ser. No. 16/867,459 filed May 5, 2020, the disclosure of which is hereby incorporated by reference in its entirety.

FIELD OF THE INVENTION

The present invention relates to an illuminance sensor, and an electronic machine and a two-dimensional (2D) image sensor having the same.

BACKGROUND OF THE INVENTION

For example, as disclosed in patent document 1, an illuminance sensor sensing ambient brightness is sometimes provided in a display device in order to control display brightness.

In such display device, an illuminance sensor is usually separated from a display portion and is disposed at an appropriate position of a frame. However, in a recent thin display device using an organic light-emitting diode (OLED) panel, the width of the so-called border portion around a display portion tends to become extremely narrow. As a result, it may be difficult to dispose an illuminance sensor at a portion separated from the display portion, which is also undesirable from design perspectives. On the other hand, in order to control the display brightness of a display device, illuminance of an environment facing a display portion is preferably sensed.

The same situations above apply to smartphones and tablet terminals. Further, it is commonly considered that an illuminance sensor may easily produce noise caused by infrared light. For example, smartphones and tablet terminals are commonly used outdoors, and such noise caused by infrared light becomes obstacles in sensing the brightness of the surrounding environment.

PRIOR ART DOCUMENT

Patent Publication

[Patent document 1] Japan Patent Publication No. 2012-104656

SUMMARY OF THE INVENTION

Problems to be Solved by the Invention

The present invention is conceived of on the basis of the situations above, and aims to provide an illuminance sensor configurable in a narrow space and capable of mitigating undesirable influences caused by infrared light, and an electronic machine and a two-dimensional image sensor using the same.

Technical Means for Solving the Problem

An illuminance sensor provided by the present invention includes a first light receiving portion and a second light receiving portion, a first optical region and a second optical region, disposed corresponding to the first light receiving portion and the second light receiving portion respectively, and a difference detecting portion, obtaining a difference between outputs of the first light receiving portion and the second light receiving portion. The first optical region and the second optical region comprise a first linear polarization plate, a first quarter-wave plate, a second quarter-wave plate and a second linear polarization plate corresponding to both the first light receiving portion and the second light receiving portion, and disposed sequentially in an order that the first linear polarization plate is farthest from the first light receiving portion and the second light receiving portion. An ineffective band of either one or both of the first and second linear polarization plates comprises at least a portion of an infrared band. The first quarter-wave plate comprises a first portion and a second portion, wherein the first portion is in the first optical region and the second portion is in the second optical region. A slow axis of the first portion comprises a relation of +45° or −45° in regard to a first polarization direction that is a polarization direction of the first linear polarization plate. A relation of a slow axis of the second portion in regard to the first polarization direction is −45° or +45° that is opposite in sign to the relation of the slow axis of the first portion in regard to the first polarization direction. A slow axis of the second quarter-wave plate comprises a relation of +45° or −45° in regard to a second polarization direction that is a polarization direction of the second linear polarization plate. The relation of the slow axis of the second quarter-wave plate in regard to the second polarization direction is the same with the relation of the slow axis of the first portion in regard to the first polarization direction.

Other details and features of the present invention are to become more apparent with the description given with the accompanying drawings below.

DETAILED DESCRIPTION OF THE EMBODIMENTS

Preferred embodiments of the present invention are specifically described in detail with the accompanying drawings below.

<Illuminance Sensor A1>

Figure 1:
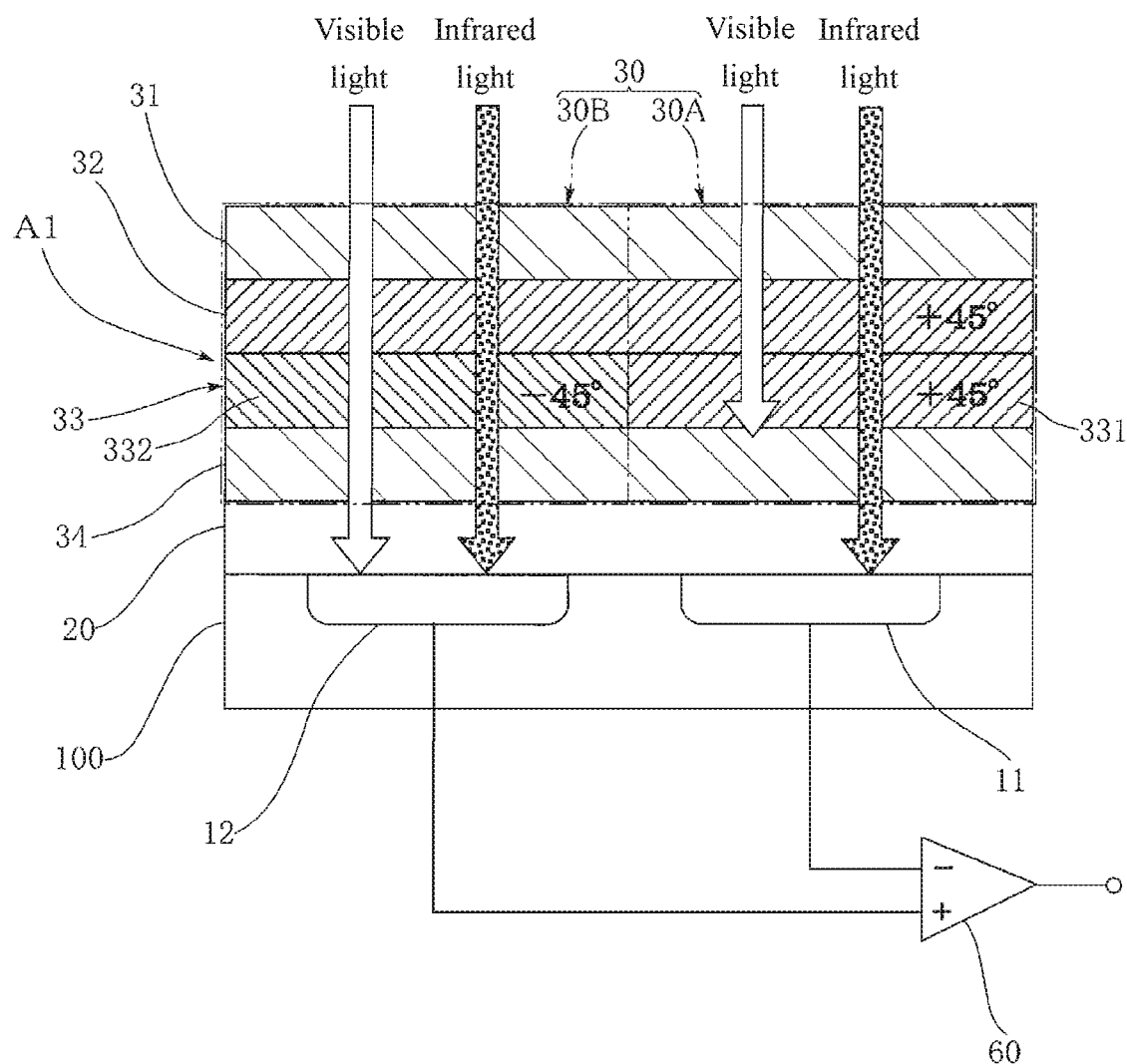
FIG. 1 is a brief configuration diagram of an illuminance sensor according to a first embodiment of the present invention.

FIG. 1 shows an illuminance sensor according to a first embodiment of the present invention, that is, an illuminance sensor A1. The illuminance sensor A1 includes a first light receiving portion 11, a second light receiving portion 12, an optical region 30, and a difference detecting portion 60.

The first light receiving portion 11 and the second light receiving portion 12 are, for example, photodiodes manufactured and incorporated into the same integrated circuit (IC), and are located in a same plane serving as the main surface of the IC 100. The optical region 30 is disposed opposite to the first light receiving portion 11 and the second light receiving portion 12. The optical region 30 has a first optical region 30A disposed corresponding to the first light receiving portion 11, and a second optical region 30B disposed corresponding to the second light receiving portion 12.

The optical region 30 (the first optical region 30A and the second optical region includes a first linear polarization plate 31, a first quarter-wave plate 32, a second quarter-wave plate 33, and a second linear polarization plate 34. The first linear polarization plate 31, the first quarter-wave plate 32, the second quarter-wave plate 33, and the second linear polarization plate 34 are disposed sequentially in an order that the first linear polarization plate 31 is farthest from the first light receiving portion 11 and the second light receiving portion 12. The first linear polarization plate 31, the first quarter-wave plate 32, the second quarter-wave plate 33, and the second linear polarization plate 34 may be closely deposited on one another, or may be interposed with an air layer or a simple transparent layer. In this embodiment, a color filter layer 20 in, for example, red, green or blue, is interposed between the first light receiving portion 11 and the second light receiving portion 12 and the second linear polarization plate 34.

Both the first linear polarization plate 31 and the second linear polarization plate 34 are similarly disposed throughout the first optical region 30A and the second optical region 30B (a region corresponding to the first light receiving portion 11 and a region corresponding to the second light receiving portion 12). In this embodiment, a polarization direction (a first polarization direction) of the first linear polarization plate 31 is the same with a polarization direction (a second polarization direction) of the second linear polarization plate 34, and is represented by slant shading lines of the same direction in FIG. 1. Further, at least any one of the first linear polarization plate 31 and second linear polarization plate 34 is implemented by a polarization plate in which an ineffective band includes at least a portion of an infrared band. Herein, an ineffective band refers to a light wavelength band that does not effectively perform polarization. That is to say, at least any one of the first linear polarization plate 31 and second linear polarization plate 34 is implemented by, for example, a polarization plate of the following characteristics: the polarization plate has a polarization function for an entire visible band, and does not polarize but allows passing through of an entire infrared band. For example, a polarization plate "MCPR-4" sold by MeCan Imaging Inc. may be used as a linear polarization plate of the foregoing characteristics. Further, a boundary between an effective band and the ineffective band of the polarization function of the linear polarization plate in which the ineffective band includes at least a portion of an infrared band does not necessarily coincide with a boundary between a visible band and an infrared band, and may be closer to the side of the visible band or the infrared band. The foregoing feature also applies to the description below.

The first quarter-wave plate 32 is located closely to a lower layer of the first linear polarization plate 31. In the entire of the first optical region 30A and the second optical region 30B (a region corresponding to the first light receiving portion 11 and a region corresponding to the second light receiving portion 12), a slow axis of the first quarter-wave plate 32 has a relation of +45° or −45° in regard to a polarization direction (a first polarization direction) of the first linear polarization plate 31. In this embodiment, the slow axis of the first quarter-wave plate 32 has a relation of +45° in regard to the first polarization direction, and is denoted by "+45°" in FIG. 1.

The second quarter-wave plate 33 is located closely to a lower layer of the first quarter-wave plate 32. The second quarter-wave plate 33 has a first portion 331 in the first optical region 30A and a second portion 332 in the second optical region 30B. The relation of a slow axis of the first portion 331 in regard a polarization direction (a second polarization direction) of the second linear polarization plate 34 is the same with the relation of the slow axis of the first quarter-wave plate 32 in regard to the polarization direction (the first polarization direction) of the first linear polarization plate 31, that is, +45° or −45°. In this embodiment, the polarization direction (the first polarization direction) of the first linear polarization plate 33 is the same with the polarization direction (the second polarization direction) of the second linear polarization plate 34, and thus the slow axis of the first portion 331 also has a relation of +45° in regard to the first polarization direction, is denoted as "+45°" in FIG. 1. On the other hand, a relation of a slow axis of the second portion 332 in regard to the polarization direction (the second polarization direction) of the second linear polarization plate 34 is opposite in sign to the relation of the slow axis of the first quarter-wave plate 32 in regard to the polarization direction (the first polarization direction) of the first linear polarization plate 31. In this embodiment, the slow axis of the second portion 332 has a relation of −45° in regard to the second polarization direction. Further, in this embodiment, the polarization direction (the first polarization direction) of the first linear polarization plate 31 is the same with the polarization direction (the second polarization direction) of the second linear polarization plate 34, and thus the slow axis of the second portion 332 also has a relation of −45° in regard to the first polarization direction, and is denoted by "−45°" in FIG. 1.

The difference detecting portion 60 obtains a difference between an output of the first light receiving portion 11 and an output of the second light receiving portion 12. The different detecting portion 60 may be implemented by, for example, a differential amplifier such as an operational amplifier.

Next, the functions of the illuminance sensor A1 shown in FIG. 1 are described individually below, for when the ineffective bands of both the first linear polarization plate 31 and the second linear polarization plate 34 include the infrared band, when the ineffective band of only the first linear polarization plate 31 between the first linear polarization plate 31 and the second linear polarization plate 34 includes the infrared band, and when the ineffective band of only the second linear polarization plate 34 between the first linear polarization plate 31 and the second linear polarization plate 34 includes the infrared band.

[When the Ineffective Bands of Both the First Linear Polarization Plate 31 and the Second Linear Polarization Plate 34 Include the Infrared Band]

Neither of the first linear polarization plate 31 and the second linear polarization plate 34 has a polarization function for infrared light, and thus both of the first light receiving portion 11 and the second light receiving portion 12 are capable of receiving infrared light.

On the other hand, regarding visible light, in the first optical region 30A (the region corresponding to the first light receiving portion 11), linearly polarized light passing through the first linear polarization plate 31 becomes circularly polarized light by the first quarter-wave plate 32)(+45°. As described above, the relation of the slow axis of the first portion 331)(+45° of the second quarter-wave plate 33 in regard to the polarization direction (the second polarization direction) of the second linear polarization plate 34 is the same with the relation of the slow axis of the first quarter-wave plate 32 in regard to the polarization direction (the first polarization direction) of the first linear polarization plate, that is, +45°. Therefore, the circularly polarized light formed by the first linear polarization plate 31 and the first quarter-wave plate 32 is incapable of passing through the second linear polarization plate 34. That is to say, the first light receiving portion 11 receives only infrared light.

Regarding visible light, in the second optical region 30B (the region corresponding to the second light receiving portion 12), the linearly polarized light passing through the first linear polarization plate 31 becomes circularly polarized light by the first quarter-wave plate)(+45°. As described above, the relation of the slow axis of the second portion 332)(−45° of the second quarter-wave plate 33 in regard to the polarization direction (the second polarization direction) of the second linear polarization plate 34 is −45° that is opposite in sign to the relation of the slow axis of the first quarter-wave plate 32 in regard to the polarization direction (the first polarization direction) of the first linear polarization plate 31. Therefore, the circularly polarized light formed by the first linear polarization plate 31 and the first quarter-wave plate 32 is capable of passing through the second linear polarization plate 34 and arriving at the second light receiving portion 12. That is to say, the second light receiving portion 12 receives both infrared light and visible light.

The difference detecting portion 60 eliminates infrared light components from light receiving amounts of the first light receiving portion 11 and the second light receiving portion 12 according to the difference between the outputs of the two light receiving portions 11 and 12, and outputs a light receiving amount of visible light as a signal. Therefore, the illuminance sensor A1 is capable of eliminating or mitigating undesirable influences such as noise caused by infrared light and performing illuminance detection.

[When the Ineffective Band of Only the First Linear Polarization Plate 31 Between the First Linear Polarization Plate 31 and the Second Linear Polarization Plate 34 Includes the Infrared Band]

Regarding infrared light, in the first optical region 30A (the region corresponding to the first light receiving portion 11), the first linear polarization plate 31 does not have a polarization function, and thus the infrared light directly passes through the first linear polarization plate 31, the first quarter-wave plate 32 and the second quarter-wave plate 33. Infrared light arriving at the second linear polarization plate 34 is polarized by the second linear polarization plate 34, and arrives at the first light receiving portion 11.

Regarding infrared light, in the second optical region 30B (the region corresponding to the second light receiving portion 12), the first linear polarization plate 31 likewise does not have a polarization function, and thus the infrared light directly passes through the first linear polarization plate 31, the first quarter-wave plate 32 and the second quarter-wave plate 33. The infrared light arriving at the second linear polarization plate 34 is polarized by the second linear polarization plate 34, and arrives at the second light receiving portion 12.

That is to say, regarding infrared light, the first light receiving portion 11 and the second light receiving portion 12 similarly receive the infrared light.

Regarding visible light, in the first optical region 30A (the region corresponding to the first light receiving portion 11), the linearly polarized light passing through the first linear polarization plate 31 becomes circularly polarized light by the first quarter-wave plate 32)(+45°. As described above, the relation of the slow axis of the first portion 331)(+45° of the second quarter-wave plate 33 in regard to the polarization direction (the second polarization direction) of the second linear polarization plate 34 is the same with the relation of the slow axis of the first quarter-wave plate 32 in regard to the polarization direction (the first polarization direction) of the first linear polarization plate 31, that is, +45°. Therefore, the circularly polarized light formed by the first linear polarization plate 31 and the first quarter-wave plate 32 is incapable of passing through the second linear polarization plate 34. That is to say, the first light receiving portion 11 receives only infrared light.

Regarding visible light, in the second optical region 30B (the region corresponding to the second light receiving portion 12), the linearly polarized light passing through the first linear polarization plate 31 becomes circularly polarized light by the first quarter-wave plate)(+45°. As described above, the relation of the slow axis of the second portion 332)(−45° of the second quarter-wave plate 33 in regard to the polarization direction (the second polarization direction) of the second linear polarization plate 34 is −45° that is opposite in sign to the relation of the slow axis of the first quarter-wave plate 32 in regard to the polarization direction (the first polarization direction) of the first linear polarization plate 31. Therefore, the circularly polarized light formed by the first linear polarization plate 31 and the first quarter-wave plate 32 is capable of passing through the second linear polarization plate 34 and arriving at the second light receiving portion 12. That is to say, the second light receiving portion 12 receives both infrared light and visible light.

The difference detecting portion 60 eliminates infrared light components from light receiving amounts of the first light receiving portion 11 and the second light receiving portion 12 according to the difference between the outputs of the two light receiving portions 11 and 12, and outputs a light receiving amount of visible light as a signal. Therefore, the illuminance sensor A1 is capable of eliminating or mitigating undesirable influences such as noise caused by infrared light and performing illuminance detection.

[When the Ineffective Band of Only the Second Linear Polarization Plate 34 Between the First Linear Polarization Plate 31 and the Second Linear Polarization Plate 34 Includes the Infrared Band]

Regarding infrared light, in the first optical region 30A (the region corresponding to the first light receiving portion 11), the infrared light is polarized at the first linear polarization plate 31, and the direction of the polarized light changes by 90° in a period of passing through the first quarter-wave plate 32 and the second quarter-wave plate 33 (the first portion 331). The second linear polarization plate 34 does not have a polarization function for infrared light, and thus the polarized light changed by 90° in direction directly arrives at the first light receiving portion 11.

Regarding infrared light, in the second optical region 30B (the region corresponding to the second light receiving portion 12), the infrared light is also polarized at the first linear polarization plate 31, and arrives at the second linear polarization plate 34 in a manner that the polarization direction thereof is not changed at timings of passing through the first quarter-wave plate 32 and the second quarter-wave plate 33 (the second portion 332). The second linear polarization plate 34 does not have a polarization function for infrared light, and thus the polarized light generated by the first linear polarization plate 31 directly arrives at the second light receiving portion 12.

That is to say, regarding infrared light, the first light receiving portion 11 and the second light receiving portion 12 receive the infrared light by the same light amount for polarized light of a phase difference of 90°.

Regarding visible light, in the first optical region 30A (the region corresponding to the first light receiving portion 11), the linearly polarized light passing through the first linear polarization plate 31 becomes circularly polarized light by the first quarter-wave plate 32)(+45°. As described above, the relation of the slow axis of the first portion 331)(+45° of the second quarter-wave plate 33 in regard to the polarization direction (the second polarization direction) of the second linear polarization plate 34 is the same with the relation of the slow axis of the first quarter-wave plate 32 in regard to the polarization direction (the first polarization direction) of the first linear polarization plate, that is, +45°. Therefore, the circularly polarized light formed by the first linear polarization plate 31 and the first quarter-wave plate 32 is incapable of passing through the second linear polarization plate 34. That is to say, the first light receiving portion 11 receives only infrared light.

Regarding visible light, in the second optical region 30B (the region corresponding to the second light receiving portion 12), the linearly polarized light passing through the first linear polarization plate 31 becomes circularly polarized light by the first quarter-wave plate 32)(+45°. As described above, the relation of the slow axis of the second portion 332)(−45° of the second quarter-wave plate 33 in regard to the polarization direction (the second polarization direction) of the second linear polarization plate 34 is −45° that is opposite in sign to the relation of the slow axis of the first quarter-wave plate 32 in regard to the polarization direction (the first polarization direction) of the first linear polarization plate 31. Therefore, the circularly polarized light formed by the first linear polarization plate 31 and the first quarter-wave plate 32 is capable of passing through the second linear polarization plate 34 and arriving at the second light receiving portion 12. That is to say, the second light receiving portion 12 receives both infrared light and visible light.

The difference detecting portion 60 eliminates infrared light components from light receiving amounts of the first light receiving portion 11 and the second light receiving portion 12 according to the difference between the outputs of the two light receiving portions 11 and 12, and outputs a light receiving amount of visible light as a signal. Therefore, the illuminance sensor A1 is capable of eliminating or mitigating undesirable influences such as noise caused by infrared light and performing illuminance detection.

<Illuminance Sensor A2>

Figure 2:
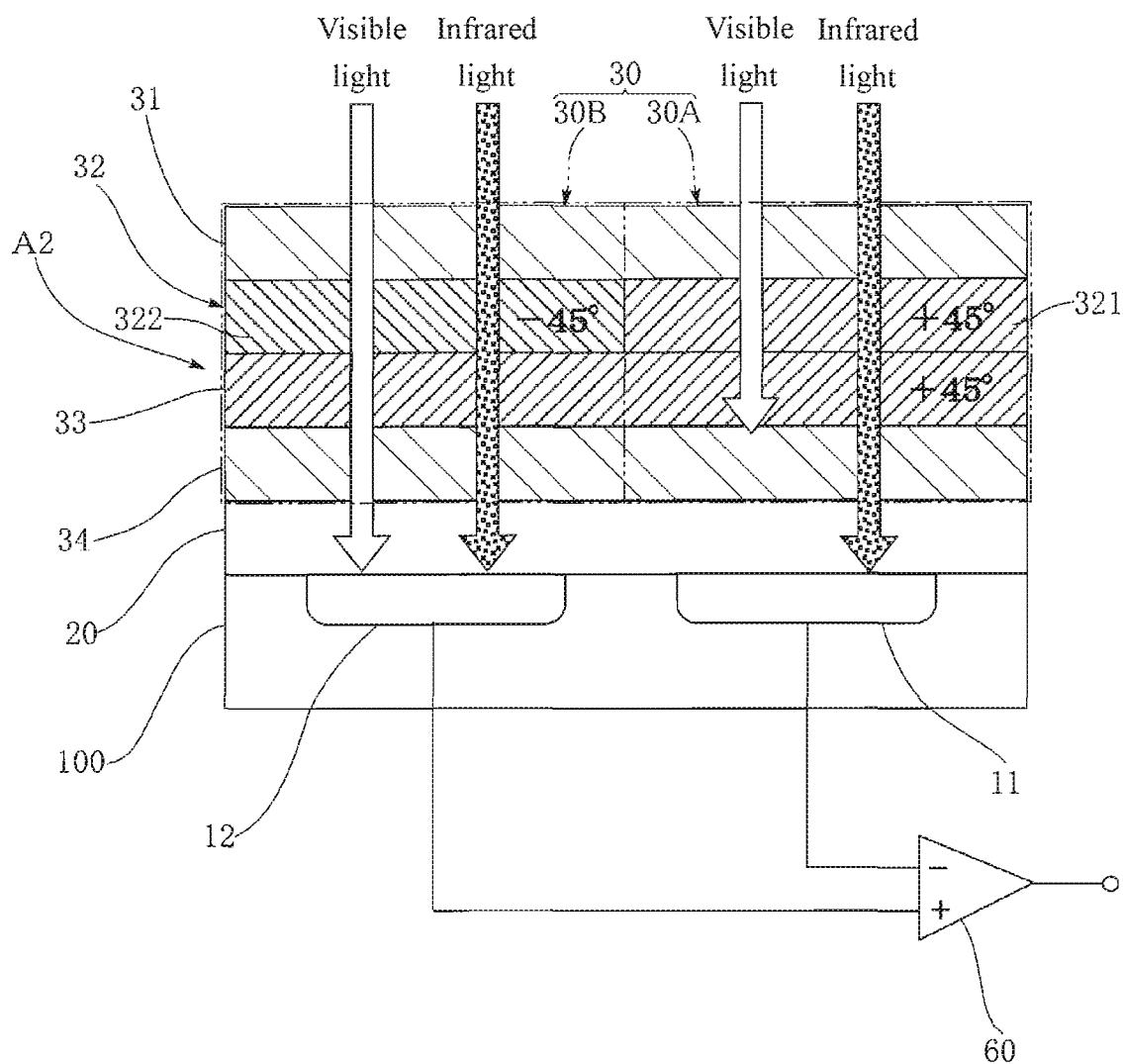
FIG. 2 is a brief configuration diagram of a variation example of the illuminance sensor shown in FIG. 1.

FIG. 2 shows an illuminance sensor A2 as a variation example of the illuminance sensor A1. In the illuminance sensor A2, the arrangements and configurations of the first quarter-wave plate 32 and the second quarter-wave plate 33 are different from those in the illuminance sensor A1 in FIG. 1, and the remaining configuration details are identical to those in the illuminance sensor A1 in FIG. 1. That is to say, in the illuminance sensor A1 in FIG. 1, the first quarter-wave plate 32 is set to "+45°" in the entire of the first optical region 30A and the second optical region 30B (the region corresponding to the first light receiving portion 11 and the region corresponding to the second light receiving portion 12). Regarding the second quarter-wave plate 33, the first portion 331 in the first optical region 30A is set to "+45°", and the second portion 332 in the second optical region 30B is set to "−45°". On the other hand, in the illuminance sensor A2 in FIG. 2, the second quarter-wave plate 33 is set to "+45°" in the entire of the first optical region 30A and the second optical region 30B. Regarding the first quarter-wave plate 32, the first portion 321 in the first optical region 30A is set to "+45°", and the second portion 322 in the second optical region 30B is set to "−45°". That is to say, the slow axis of the first portion 321 of the first quarter-wave plate 32 has a relation of +45° in regard to the polarization direction (the first polarization direction) of the first linear polarization plate 31, and the relation of the slow axis of the second portion 322 of the first quarter-wave plate 32 to the first polarization direction is −45° that is opposite in sign to the relation of the first portion 321. The relation of the slow axis of the second quarter-wave plate 33 in regard to the polarization direction (the second polarization direction) of the second linear polarization plate 34 is the same with the relation of the slow axis of the first portion 321 in regard to the first polarization direction, that is, +45°. On the other hand, the relation of the slow axis of the second quarter-wave plate 33 in regard to the second polarization direction is +45° that is opposite in sign to the relation of the slow axis of the second portion 322 in regard to the first polarization relation)(−45°.

Further, the functions of the illuminance sensor A2 shown in FIG. 2 are described individually below, for when the ineffective bands of both the first linear polarization plate 31 and the second linear polarization plate 34 include the infrared band, when the ineffective band of only the first linear polarization plate 31 between the first linear polarization plate 31 and the second linear polarization plate 34 includes the infrared band, and when the ineffective band of only the second linear polarization plate 34 between the first linear polarization plate 31 and the second linear polarization plate 34 includes the infrared band.

[When the Ineffective Bands of Both the First Linear Polarization Plate 31 and the Second Linear Polarization Plate 34 Include the Infrared Band]

Neither of the first linear polarization plate 31 and the second linear polarization plate 34 has a polarization function for infrared light, and thus both of the first light receiving portion 11 and the second light receiving portion 12 are capable of receiving infrared light.

On the other hand, regarding visible light, in the first optical region 30A (the region corresponding to the first light receiving portion 11), linearly polarized light passing through the first linear polarization plate 31 becomes circularly polarized light by the first portion 321)(+45° of the first quarter-wave plate 32. As described above, the relation of the slow axis of the second quarter-wave plate 33 in regard to the polarization direction (the second polarization direction) of the second linear polarization plate 34 is the same with the relation of the slow axis of the first portion 321 in regard to the first polarization direction, that is, +45°. Therefore, the circularly polarized light formed by the first linear polarization plate 31 and the first portion 321 of the first quarter-wave plate 32 is incapable of passing through the second linear polarization plate 34. That is to say, the first light receiving portion 11 receives only infrared light.

Regarding visible light, in the second optical region 30B (the region corresponding to the second light receiving region 12), linearly polarized light passing through the first linear polarization plate 31 becomes circularly polarized light by the second portion 322)(−45° of the first quarter-wave plate 32. As described above, the relation of the slow axis of the second quarter-wave plate 33 in regard to the second polarization direction is +45° that is opposite in sign to the relation of the slow axis of the second portion 322 in regard to the first polarization direction)(−45°. Therefore, the circularly polarized light formed by the first linear polarization plate 31 and the second portion 322 of the first quarter-wave plate 32 is capable of passing through the second linear polarization plate 34 and arriving at the second light receiving portion 12. That is to say, the second light receiving portion 12 receives both infrared light and visible light.

The difference detecting portion 60 eliminates infrared light components from light receiving amounts of the first light receiving portion 11 and the second light receiving portion 12 according to the difference between the outputs of the two light receiving portions 11 and 12, and outputs a light receiving amount of visible light as a signal. Therefore, the illuminance sensor A2 is capable of eliminating or mitigating undesirable influences such as noise caused by infrared light and performing illuminance detection.

[When the Ineffective Band of Only the First Linear Polarization Plate 31 Between the First Linear Polarization Plate 31 and the Second Linear Polarization Plate 34 Includes the Infrared Band]

Regarding infrared light, in the first optical region 30A (the region corresponding to the first light receiving portion 11), the first linear polarization plate 31 does not have a polarization function, and thus the infrared light directly passes through the first linear polarization plate 31, the first quarter-wave plate 32 and the second quarter-wave plate 33. Infrared light arriving at the second linear polarization plate 34 is polarized by the second linear polarization plate 34, and arrives at the first light receiving portion 11.

Regarding infrared light, in the second optical region 30B (the region corresponding to the second light receiving portion 12), the first linear polarization plate 31 likewise does not have a polarization function, and thus the infrared light directly passes through the first linear polarization plate 31, the first quarter-wave plate 32 and the second quarter-wave plate 33. The infrared light arriving at the second linear polarization plate 34 is polarized by the second linear polarization plate 34, and arrives at the second light receiving portion 12.

Regarding infrared light, the first light receiving portion 11 and the second light receiving portion 12 similarly receive the infrared light.

Regarding visible light, in the first optical region 30A (the region corresponding to the first light receiving portion 11), linearly polarized light passing through the first linear polarization plate 31 becomes circularly polarized light by the first portion 321)(+45° of the first quarter-wave plate 32. As described above, the relation of the slow axis of the second quarter-wave plate 33 in regard to the polarization direction (the second polarization direction) of the second linear polarization plate 34 is the same with the relation of the slow axis of the first portion 321 in regard to the first polarization direction, that is, +45°. Therefore, the circularly polarized light formed by the first linear polarization plate 31 and the first portion 321 of the first quarter-wave plate 32 is incapable of passing through the second linear polarization plate 34. That is to say, the first light receiving portion 11 receives only infrared light.

Regarding visible light, in the second optical region 30B (the region corresponding to the second light receiving region 12), linearly polarized light passing through the first linear polarization plate 31 becomes circularly polarized light by the second portion 322)(−45° of the first quarter-wave plate 32. As described above, the relation of the slow axis of the second quarter-wave plate 33 in regard to the second polarization direction is +45° that is opposite in sign to the relation of the slow axis of the second portion 322 in regard to the first polarization direction)(−45°. Therefore, the circularly polarized light formed by the first linear polarization plate 31 and the second portion 322 of the first quarter-wave plate 32 is capable of passing through the second linear polarization plate 34 and arriving at the second light receiving portion 12. That is to say, the second light receiving portion 12 receives both infrared light and visible light.

The difference detecting portion 60 eliminates infrared light components from light receiving amounts of the first light receiving portion 11 and the second light receiving portion 12 according to the difference between the outputs of the two light receiving portions 11 and 12, and outputs a light receiving amount of visible light as a signal. Therefore, the illuminance sensor A2 is capable of eliminating or mitigating undesirable influences such as noise caused by infrared light and performing illuminance detection.

[When the Ineffective Band of Only the Second Linear Polarization Plate 34 Between the First Linear Polarization Plate 31 and the Second Linear Polarization Plate 34 Includes the Infrared Band]

Regarding infrared light, in the first optical region 30A (the region corresponding to the first light receiving portion 11), the infrared light is polarized at the first linear polarization plate 31, and the polarization direction thereof changes by 90° in a period of passing through the first quarter-wave plate 32 (the first portion 321) and the second quarter-wave plate 33. The second linear polarization plate 34 does not have a polarization function for infrared light, and thus the polarized light changed by 90° in direction directly arrives at the first light receiving portion 11.

Regarding infrared light, in the second optical region 30B (the region corresponding to the second light receiving portion 12), the infrared light is polarized at the first linear polarization plate 31, and arrives the second linear polarization plate 34 without changing in direction at timings of passing through the first quarter-wave plate 32 (the second portion 322) and the second quarter-wave plate 33. The second linear polarization plate 34 does not have a polarization function for infrared light, and thus the polarized light generated by the first linear polarization plate 31 directly arrives at the second light receiving portion 12.

That is to say, regarding infrared light, the first light receiving portion 11 and the second light receiving portion 12 receive the infrared light by the same light amount for polarized light of a phase difference of 90°.

Regarding visible light, in the first optical region 30A (the region corresponding to the first light receiving portion 11), linearly polarized light passing through the first linear polarization plate 31 becomes circularly polarized light by the first portion 321)(+45° of the first quarter-wave plate 32. As described above, the relation of the slow axis of the second quarter-wave plate 33 in regard to the polarization direction (the second polarization direction) of the second linear polarization plate 34 is the same with the relation of the slow axis of the first portion 321 in regard to the first polarization direction, that is, +45°. Therefore, the circularly polarized light formed by the first linear polarization plate 31 and the first portion 321 of the first quarter-wave plate 32 is incapable of passing through the second linear polarization plate 34. That is to say, the first light receiving portion 11 receives only infrared light.

Regarding visible light, in the second optical region 30B (the region corresponding to the second light receiving portion 12), linearly polarized light passing through the first linear polarization plate 31 becomes circularly polarized light by the second portion 322)(−45° of the first quarter-wave plate 32. As described above, the relation of the slow axis of the second quarter-wave plate 33 in regard to the second polarization direction is +45° that is opposite in sign to the relation of the slow axis of the second portion 322 in regard to the first polarization direction)(−45°. Therefore, the circularly polarized light formed by the first linear polarization plate 31 and the second portion 322 of the first quarter-wave plate 32 is capable of passing through the second linear polarization plate 34 and arriving at the second light receiving portion 12. That is to say, the second light receiving portion 12 receives both infrared light and visible light.

The difference detecting portion 60 eliminates infrared light components from light receiving amounts of the first light receiving portion 11 and the second light receiving portion 12 according to the difference between the outputs of the two light receiving portions 11 and 12, and outputs a light receiving amount of visible light as a signal. Therefore, the illuminance sensor A2 is capable of eliminating or mitigating undesirable influences such as noise caused by infrared light and performing illuminance detection.

<Illuminance Sensor A3>

Figure 3:
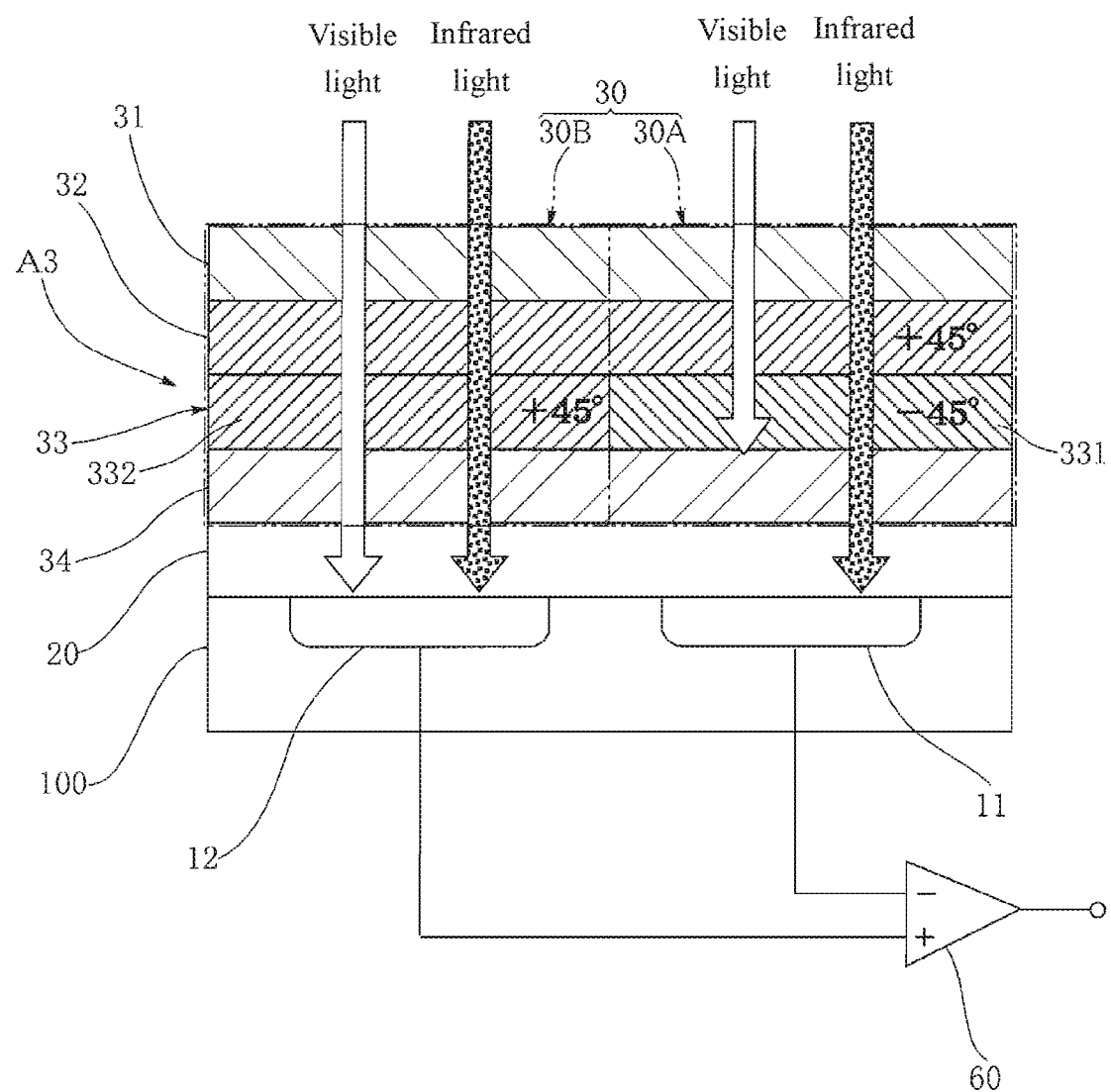
FIG. 3 is a brief configuration diagram of an illuminance sensor according to a second embodiment of the present invention.

FIG. 3 shows an illuminance sensor A3 as an illuminance sensor according to a second embodiment of the present invention. Compared to the illuminance sensor A1 in FIG. 1, the illuminance sensor A3 differs in terms of the relation of the polarization directions of the first linear polarization plate 31 and the second linear polarization plate 34, and the arrangements and configurations of the first quarter-wave plate 32 and the second quarter-wave plate 33, and the remaining configuration details are identical to those in the illuminance sensor A1 in FIG. 1. That is to say, in the illuminance sensor A3 in FIG. 3, the polarization direction (the first polarization direction) of the first linear polarization plate 31 differs from the polarization direction (the second polarization direction) of the second linear polarization plate 34 by 90°. In FIG. 3, slant shading lines in different directions are used for representation. The first quarter-wave plate 32 is set to "+45°" in the entire of the first optical region 30A and the second optical region 30B (the region corresponding to the first light receiving region 11 and the region corresponding to the second light receiving region 12). Regarding the second quarter-wave plate 33, the first portion 331 in the first optical region 30A is set to "−45°", and the second portion 332 in the second optical region 30B is set to "+45°". That is to say, the slow axis of the first quarter-wave plate 32 has a relation of +45° in regard to the polarization direction (the first polarization) of the first linear polarization plate 32. The slow axis of the first portion 331 of the second quarter-wave plate 33 has a relation of −45° in regard to the first polarization direction. In this embodiment, the polarization direction (the first polarization direction) of the first linear polarization plate 31 differs from the polarization direction (the second polarization direction) of the second linear polarization plate 34 by 90°, and hence the slow axis of the first portion 331 of the second quarter-wave plate 33 has a relation of +45° in regard to the polarization direction (the second polarization direction) of the second linear polarization plate 34. Therefore, the relation of the slow axis of the first portion 331 in regard to the polarization (the second polarization direction) of the second linear polarization plate 34 is the same with the relation of the slow axis of the first quarter-wave plate 32 in regard to the polarization direction (the first polarization direction) of the first linear polarization plate 31, that is, +45°. On the other hand, the slow axis of the second portion 332 of the second quarter-wave plate 33 has a relation of +45° in regard to the polarization direction (the first polarization direction) of the first linear polarization plate 31. The polarization direction (the first polarization direction) of the first linear polarization plate 31 differs from the polarization direction (the second polarization direction) of the second linear polarization direction 34 by 90°, and hence the slow axis of the second portion 332 of the second quarter-wave plate 33 has a relation of −45° in regard to the polarization direction (the second polarization direction) of the second linear polarization plate 34. Therefore, the relation of the slow axis of the first portion 331 in regard to the polarization direction (the second polarization direction) of the second linear polarization plate 34 is −45° that is opposite in sign to the relation of the slow axis of the first quarter-wave plate 32 in regard to the polarization direction (the first polarization direction) of the first linear polarization plate 31.

Next, functions of the illuminance sensor A3 shown in FIG. 3 are described individually below, for when the ineffective bands of both the first linear polarization plate 31 and the second linear polarization plate 34 include the infrared band, when the ineffective band of only the first linear polarization plate 31 between the first linear polarization plate 31 and the second linear polarization plate 34 includes the infrared band, and when the ineffective band of only the second linear polarization plate 34 between the first linear polarization plate 31 and the second linear polarization plate 34 includes the infrared band.

[When the Ineffective Bands of Both the First Linear Polarization Plate 31 and the Second Linear Polarization Plate 34 Include the Infrared Band]

Neither of the first linear polarization plate 31 and the second linear polarization plate 34 has a polarization function for infrared light, and thus both of the first light receiving portion 11 and the second light receiving portion 12 are capable of receiving infrared light.

On the other hand, regarding visible light, in the first optical region 30A (the region corresponding to the first light receiving portion 11), linearly polarized light passing through the first linear polarization plate 31 becomes circularly polarized light by the first quarter-wave plate 32)(+45°. As described above, the relation of the slow axis of the first portion 331 of the second quarter-wave plate 33 in regard to the polarization direction (the second polarization direction) of the second linear polarization plate 34 is the same with the relation of the slow axis of the first quarter-wave plate 32 in regard to the polarization direction (the first polarization direction) of the first linear polarization plate 31, that is, +45°. Therefore, the circularly polarized light formed by the first linear polarization plate 31 and the first quarter-wave plate 32 is incapable of passing through the second linear polarization plate 34. That is to say, the first light receiving portion 11 receives only infrared light.

Regarding visible light, in the second optical region 30B (the region corresponding to the second light receiving portion 12), linearly polarized light passing through the first polarization plate 31 becomes circularly polarized light by the first quarter-wave plate 32)(+45°. As described above, the relation of the slow axis of the second portion 332 of the second quarter-wave plate 33 in regard to the polarization direction (the second polarization direction) of the second linear polarization plate 34 is −45° that is opposite in sign to the relation of the slow axis of the first quarter-wave plate 32 in regard to the polarization direction (the first polarization direction) of the first linear polarization plate 31. Therefore, the circularly polarized light formed by the first linear polarization plate 31 and the first quarter-wave plate 32 is capable of passing through the second linear polarization plate 34 and arriving at the second light receiving portion 12. That is to say, the second light receiving portion 12 receives both infrared light and visible light.

The difference detecting portion 60 eliminates infrared light components from light receiving amounts of the first light receiving portion 11 and the second light receiving portion 12 according to the difference between the outputs of the two light receiving portions 11 and 12, and outputs a light receiving amount of visible light as a signal. Therefore, the illuminance sensor A3 is capable of eliminating or mitigating undesirable influences such as noise caused by infrared light and performing illuminance detection.

[When the Ineffective Band of Only the First Linear Polarization Plate 31 Between the First Linear Polarization Plate 31 and the Second Linear Polarization Plate 34 Includes the Infrared Band]

Regarding infrared light, in the first optical region 30A (the region corresponding to the first light receiving portion 11), the first linear polarization plate 31 does not have a polarization function, and thus the infrared light directly passes through the first linear polarization plate 31, the first quarter-wave plate 32 and the second quarter-wave plate 33. Infrared light arriving at the second linear polarization plate 34 is polarized by the second linear polarization plate 34, and arrives at the first light receiving portion 11.

Regarding infrared light, in the second optical region 30B (the region corresponding to the second light receiving portion 12), the first linear polarization plate 31 likewise does not have a polarization function, and thus the infrared light directly passes through the first linear polarization plate 31, the first quarter-wave plate 32 and the second quarter-wave plate 33. The infrared light arriving at the second linear polarization plate 34 is polarized by the second linear polarization plate 34, and arrives at the second light receiving portion 12.

Regarding infrared light, the first light receiving portion 11 and the second light receiving portion 12 similarly receive the infrared light.

Regarding visible light, in the first optical region 30A (the region corresponding to the first light receiving portion 11), the linearly polarized light passing through the first linear polarization plate 31 becomes circularly polarized light by the first quarter-wave plate 32)(+45°. As described above, the relation of the slow axis of the first portion 331 of the second quarter-wave plate 33 in regard to the polarization direction (the second polarization direction) of the second linear polarization plate 34 is the same with the relation of the slow axis of the first quarter-wave plate 32 in regard to the polarization direction (the first polarization direction) of the first linear polarization plate 31, that is, +45°. Therefore, the circularly polarized light formed by the first linear polarization plate 31 and the first quarter-wave plate 32 is incapable of passing through the second linear polarization plate 34. That is to say, the first light receiving portion 11 receives only infrared light.

Regarding visible light, in the second optical region 30B (the region corresponding to the second light receiving portion 12), the linearly polarized light passing through the first linear polarization plate 31 becomes circularly polarized light by the first quarter-wave plate 32)(+45°. As described above, the relation of the slow axis of the second portion 332 of the second quarter-wave plate 33 in regard to the polarization direction (the second polarization direction) of the second linear polarization plate 34 is −45° that is opposite in sign to the relation of the slow axis of the first quarter-wave plate 32 in regard to the polarization direction (the first polarization direction) of the first linear polarization plate 31. Therefore, the circularly polarized light formed by the first linear polarization plate 31 and the first quarter-wave plate 32 is capable of passing through the second linear polarization plate 34 and arriving at the second light receiving portion 12. That is to say, the second light receiving portion 12 receives both infrared light and visible light.

The difference detecting portion 60 eliminates infrared light components from light receiving amounts of the first light receiving portion 11 and the second light receiving portion 12 according to the difference between the outputs of the two light receiving portions 11 and 12, and outputs a light receiving amount of visible light as a signal. Therefore, the illuminance sensor A3 is capable of eliminating or mitigating undesirable influences such as noise caused by infrared light and performing illuminance detection.

[When the Ineffective Band of Only the Second Linear Polarization Plate 34 Between the First Linear Polarization Plate 31 and the Second Linear Polarization Plate 34 Includes the Infrared Band]

Regarding infrared light, in the first optical region 30A (the region corresponding to the first light receiving portion 11), the infrared light is polarized at the first linear polarization plate 31, and arrives at the second linear polarization plate 34 in a manner that the polarization direction thereof is not changed at timings of passing through the first quarter-wave plate 32 and the second quarter-wave plate 33 (the first portion 331). The second polarization plate 34 does not have a polarization function for infrared light, and thus polarized light generated by the first linear polarization plate 31 directly arrives at the first light receiving portion 11.

Regarding infrared light, in the second optical region 30B (the region corresponding to the second light receiving portion 12), the infrared light is polarized at the first linear polarization plate 31, and the polarization direction thereof changes by 90° at timings in a period of passing through the first quarter-wave plate 32 and the second quarter-wave plate 33 (the second portion 332). The second polarization plate 34 does not have a polarization function for infrared light, and thus the foregoing polarized light changed by 90° directly arrives at the second light receiving portion 12.

That is to say, regarding infrared light, the first light receiving portion 11 and the second light receiving portion 12 receive the infrared light by the same light amount for polarized light of a phase difference of 90°.

Regarding visible light, in the first optical region 30A (the region corresponding to the first light receiving portion 11), the linearly polarized light passing through the first linear polarization plate 31 becomes circularly polarized light by the first quarter-wave plate 32)(+45°. As described above, the relation of the slow axis of the first portion 331 of the second quarter-wave plate 33 in regard to the polarization direction (the second polarization direction) of the second linear polarization plate 34 is the same with the relation of the slow axis of the first quarter-wave plate 32 in regard to the polarization direction (the first polarization direction) of the first linear polarization plate 31, that is, +45°. Therefore, the circularly polarized light formed by the first linear polarization plate 31 and the first quarter-wave plate 32 is incapable of passing through the second linear polarization plate 34. That is to say, the first light receiving portion 11 receives only infrared light.

Regarding visible light, in the second optical region 30B (the region corresponding to the second light receiving portion 12), the linearly polarized light passing through the first linear polarization plate 31 becomes circularly polarized light by the first quarter-wave plate)(+45°. As described above, the relation of the slow axis of the second portion 332 of the second quarter-wave plate 33 in regard to the polarization direction (the second polarization direction) of the second linear polarization plate 34 is −45° that is opposite in sign to the relation of the slow axis of the first quarter-wave plate 32 in regard to the polarization direction (the first polarization direction) of the first linear polarization plate 31. Therefore, the circularly polarized light formed by the first linear polarization plate 31 and the first quarter-wave plate 32 is capable of passing through the second linear polarization plate 34 and arriving at the second light receiving portion 12. That is to say, the second light receiving portion 12 receives both infrared light and visible light.

The difference detecting portion 60 eliminates infrared light components from light receiving amounts of the first light receiving portion 11 and the second light receiving portion 12 according to the difference between the outputs of the two light receiving portions 11 and 12, and outputs a light receiving amount of visible light as a signal. Therefore, the illuminance sensor A3 is capable of eliminating or mitigating undesirable influences such as noise caused by infrared light and performing illuminance detection.

<Illuminance Sensor A4>

Figure 4:
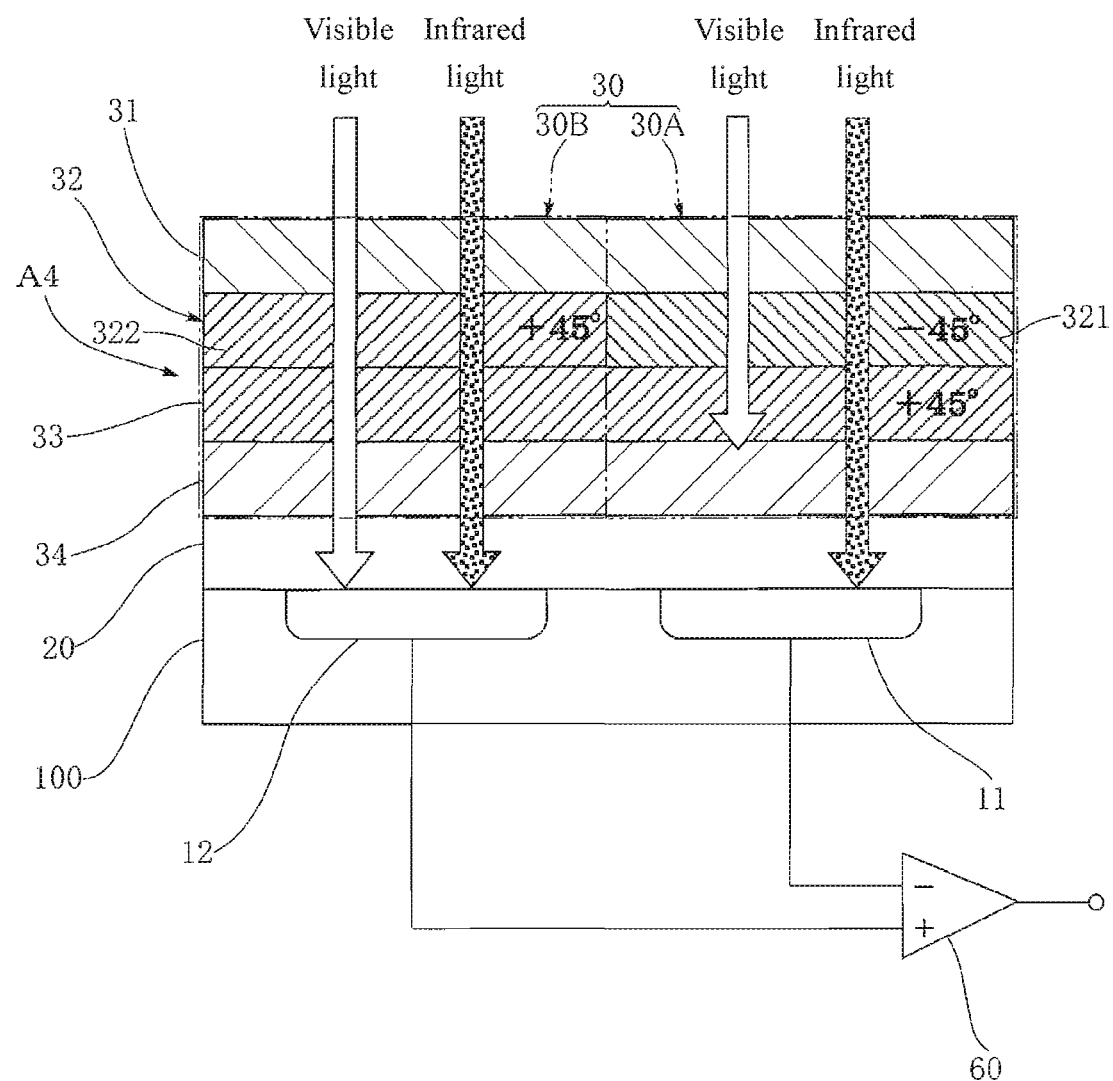
FIG. 4 is a brief configuration diagram of a variation example of the illuminance sensor shown in FIG. 2.

FIG. 4 shows an illuminance sensor A4 as a variation example of the illuminance sensor A3. In the illuminance sensor A4, the arrangements and configurations of the first quarter-wave plate 32 and the second quarter-wave plate 33 are different from those in the illuminance sensor A3 in FIG. 3, and the remaining configuration details are identical to those in the illuminance sensor A3 in FIG. 3. That is to say, in the illuminance sensor A3 in FIG. 3, the first quarter-wave plate 32 is set as "+45°" in the entire of the first optical region 30A and the optical region 30B (a region corresponding to the first receiving portion 11 and a region corresponding to the second light receiving portion 12). Regarding the second quarter-wave plate 33, the first portion 331 in the first optical region 30A is set to "−45°", and the second portion 332 in the second optical region 30B is set to "+45°". On the other hand, in the illuminance sensor A4 in FIG. 4, the second quarter-wave plate 33 is set to "+45°" in the entire of the first optical region 30A and the second optical region 30B. Regarding the first quarter-wave plate 32, the first portion 321 in the first optical region 30A is set to "−45°", and the second portion 322 in the second optical region 30B is set to "+45°". That is to say, the slow axis of the first portion 321 of the first quarter-wave plate 32 has a relation of −45° in regard to the polarization direction (the first polarization direction) of the first linear polarization plate 31, and the relation of the slow axis of the second portion 322 of the first quarter-wave plate 32 in regard to the first polarization direction is +45° that is opposite in sign to the relation of the first portion 321. The slow axis of the second quarter-plate 33 has a relation of +45° in regard to the first polarization direction. In this embodiment, similar to the illuminance sensor A3 in FIG. 3, the polarization direction (the first polarization direction) of the first linear polarization plate 31 differs from the polarization direction (the second polarization direction) of the second linear polarization plate 34 by 90°, and thus the slow axis of the second quarter-wave plate 33 has a relation of −45° in regard to the polarization direction (the second polarization direction) of the second linear polarization plate 34. Therefore, the relation of the slow axis of the second quarter-wave plate 33 in regard to the polarization direction (the second polarization direction) of the second linear polarization plate 34 is the same with the relation of the slow axis of the first portion 321 of the first quarter-wave plate 32 in regard to the polarization direction (the first polarization direction) of the first linear polarization plate 31, that is, −45°. On the other hand, the relation of the slow axis of the second quarter-wave plate 33 in regard to the second polarization direction is −45° that is opposite in sign to the relation)(+45° of the slow axis of the second portion 322 of the first quarter-wave plate 32 in regard to the first polarization direction.

Next, the functions of the illuminance sensor A4 shown in FIG. 4 are described individually below, for when the ineffective bands of both the first linear polarization plate 31 and the second linear polarization plate 34 include the infrared band, when the ineffective band of only the first linear polarization plate 31 between the first linear polarization plate 31 and the second linear polarization plate 34 includes the infrared band, and when the ineffective band of only the second linear polarization plate 34 between the first linear polarization plate 31 and the second linear polarization plate 34 includes the infrared band.

[When the Ineffective Bands of Both the First Linear Polarization Plate 31 and the Second Linear Polarization Plate 34 Include the Infrared Band]

Neither of the first linear polarization plate 31 and the second linear polarization plate 34 has a polarization function for infrared light, and thus both of the first light receiving portion 11 and the second light receiving portion 12 are capable of receiving infrared light.

On the other hand, regarding visible light, in the first optical region 30A (the region corresponding to the first light receiving portion 11), linearly polarized light passing through the first linear polarization plate 31 becomes circularly polarized light by the first portion 321)(−45° of the first quarter-wave plate 32. As described above, the relation of the slow axis of the second quarter-wave plate 33 in regard to the polarization direction (the second polarization direction) of the second linear polarization plate 34 is the same with the relation of the slow axis of the first portion 321 in regard to the first polarization direction, that is, −45°. Therefore, the circularly polarized light formed by the first linear polarization plate 31 and the first portion 321 of the first quarter-wave plate 32 is incapable of passing through the second linear polarization plate 34. That is to say, the first light receiving portion 11 receives only infrared light.

Regarding visible light, in the second optical region 30B (the region corresponding to the second light receiving portion 12), linearly polarized light passing through the first linear polarization plate 31 becomes circularly polarized light by the second portion 322)(+45° of the first quarter-wave plate 32. As described above, the relation of the slow axis of the second quarter-wave plate 33 in regard to the second polarization direction is −45° that is opposite in sign to the relation)(+45° of the slow axis of the second portion 322 in regard to the first polarization direction. Therefore, the circularly polarized light formed by the first linear polarization plate 31 and the second portion 322 of the first quarter-wave plate 32 is capable of passing through the second linear polarization plate 34 and arriving at the second light receiving portion 12. That is to say, the second light receiving portion 12 receives both infrared light and visible light.

The difference detecting portion 60 eliminates infrared light components from light receiving amounts of the first light receiving portion 11 and the second light receiving portion 12 according to the difference between the outputs of the two light receiving portions 11 and 12, and outputs a light receiving amount of visible light as a signal. Therefore, the illuminance sensor A4 is capable of eliminating or mitigating undesirable influences such as noise caused by infrared light and performing illuminance detection.

[When the Ineffective Band of Only the First Linear Polarization Plate 31 Between the First Linear Polarization Plate 31 and the Second Linear Polarization Plate 34 Includes the Infrared Band]

Regarding infrared light, in the first optical region 30A (the region corresponding to the first light receiving portion 11), the first linear polarization plate 31 does not have a polarization function, and thus the infrared light directly passes through the first linear polarization plate 31, the first quarter-wave plate 32 and the second quarter-wave plate 33. Infrared light arriving at the second linear polarization plate 34 is polarized by the second linear polarization plate 34, and arrives at the first light receiving portion 11.

Regarding infrared light, in the second optical region 30B (the region corresponding to the second light receiving portion 12), the first linear polarization plate 31 likewise does not have a polarization function, and thus the infrared light directly passes through the first linear polarization plate 31, the first quarter-wave plate 32 and the second quarter-wave plate 33. The infrared light arriving at the second linear polarization plate 34 is polarized by the second linear polarization plate 34, and arrives at the second light receiving portion 12.

Regarding infrared light, the first light receiving portion 11 and the second light receiving portion 12 similarly receive the infrared light.

On the other hand, regarding visible light, in the first optical region 30A (the region corresponding to the first light receiving portion 11), linearly polarized light passing through the first linear polarization plate 31 becomes circularly polarized light by the first portion 321)(−45° of the first quarter-wave plate 32. As described above, the relation of the slow axis of the second quarter-wave plate 33 in regard to the polarization direction (the second polarization direction) of the second linear polarization plate 34 is the same with the relation of the slow axis of the first portion 321 in regard to the first polarization direction, that is, −45°. Therefore, the circularly polarized light formed by the first linear polarization plate 31 and the first portion 321 of the first quarter-wave plate 32 is incapable of passing through the second linear polarization plate 34. That is to say, the first light receiving portion 11 receives only infrared light.

Regarding visible light, in the second optical region 30B (the region corresponding to the second light receiving portion 12), linearly polarized light passing through the first linear polarization plate 31 becomes circularly polarized light by the second portion 322)(+45° of the first quarter-wave plate 32. As described above, the relation of the slow axis of the second quarter-wave plate 33 in regard to the second polarization direction is −45° that is opposite in sign to the relation)(+45° of the slow axis of the second portion 322 in regard to the first polarization direction. Therefore, the circularly polarized light formed by the first linear polarization plate 31 and the second portion 322 of the first quarter-wave plate 32 is capable of passing through the second linear polarization plate 34 and arriving at the second light receiving portion 12. That is to say, the second light receiving portion 12 receives both infrared light and visible light.

The difference detecting portion 60 eliminates infrared light components from light receiving amounts of the first light receiving portion 11 and the second light receiving portion 12 according to the difference between the outputs of the two light receiving portions 11 and 12, and outputs a light receiving amount of visible light as a signal. Therefore, the illuminance sensor A4 is capable of eliminating or mitigating undesirable influences such as noise caused by infrared light and performing illuminance detection.

[When the Ineffective Band of Only the Second Linear Polarization Plate 34 Between the First Linear Polarization Plate 31 and the Second Linear Polarization Plate 34 Includes the Infrared Band]

Regarding infrared light, in the first optical region 30A (the region corresponding to the first light receiving portion 11), the infrared light is polarized at the first linear polarization plate 31, and arrives at the second linear polarization plate 34 in a manner that the polarization direction thereof is not changed at timings of passing through the first quarter-wave plate 32 (the first portion 321) and the second quarter-wave plate 33. The second polarization plate 34 does not have a polarization function for infrared light, and thus polarized light generated by the first linear polarization plate 31 directly arrives at the first light receiving portion 11.

Regarding infrared light, in the second optical region 30B (the region corresponding to the second light receiving portion 12), the infrared light is polarized at the first linear polarization plate 31, and the polarization direction thereof changes by 90° in a period of passing through the first quarter-wave plate 32 (the second portion 322) and the second quarter-wave plate 33. The second polarization plate 34 does not have a polarization function for infrared light, and thus the foregoing polarized light changed by 90° directly arrives at the second light receiving portion 12.

That is to say, regarding infrared light, the first light receiving portion 11 and the second light receiving portion 12 receive the infrared light by the same light amount for polarized light of a phase difference of 90°.

On the other hand, regarding visible light, in the first optical region 30A (the region corresponding to the first light receiving portion 11), linearly polarized light passing through the first linear polarization plate 31 becomes circularly polarized light by the first portion 321)(−45° of the first quarter-wave plate 32. As described above, the relation of the slow axis of the second quarter-wave plate 33 in regard to the polarization direction (the second polarization direction) of the second linear polarization plate 34 is the same with the relation of the slow axis of the first portion 321 in regard to the first polarization direction, that is, −45°. Therefore, the circularly polarized light formed by the first linear polarization plate 31 and the first portion 321 of the first quarter-wave plate 32 is incapable of passing through the second linear polarization plate 34. That is to say, the first light receiving portion 11 receives only infrared light.

Regarding visible light, in the second optical region 30B (the region corresponding to the second light receiving portion 12), linearly polarized light passing through the first linear polarization plate 31 becomes circularly polarized light by the second portion 322)(+45° of the first quarter-wave plate 32. As described above, the relation of the slow axis of the second quarter-wave plate 33 in regard to the second polarization direction is −45° that is opposite in sign to the relation)(+45° of the slow axis of the second portion 322 in regard to the first polarization direction. Therefore, the circularly polarized light formed by the first linear polarization plate 31 and the second portion 322 of the first quarter-wave plate 32 is capable of passing through the second linear polarization plate 34 and arriving at the second light receiving portion 12. That is to say, the second light receiving portion 12 receives both infrared light and visible light.

The difference detecting portion 60 eliminates infrared light components from light receiving amounts of the first light receiving portion 11 and the second light receiving portion 12 according to the difference between the outputs of the two light receiving portions 11 and 12, and outputs a light receiving amount of visible light as a signal. Therefore, the illuminance sensor A4 is capable of eliminating or mitigating undesirable influences such as noise caused by infrared light and performing illuminance detection.

<Illuminance Sensor A5>

Figure 5:
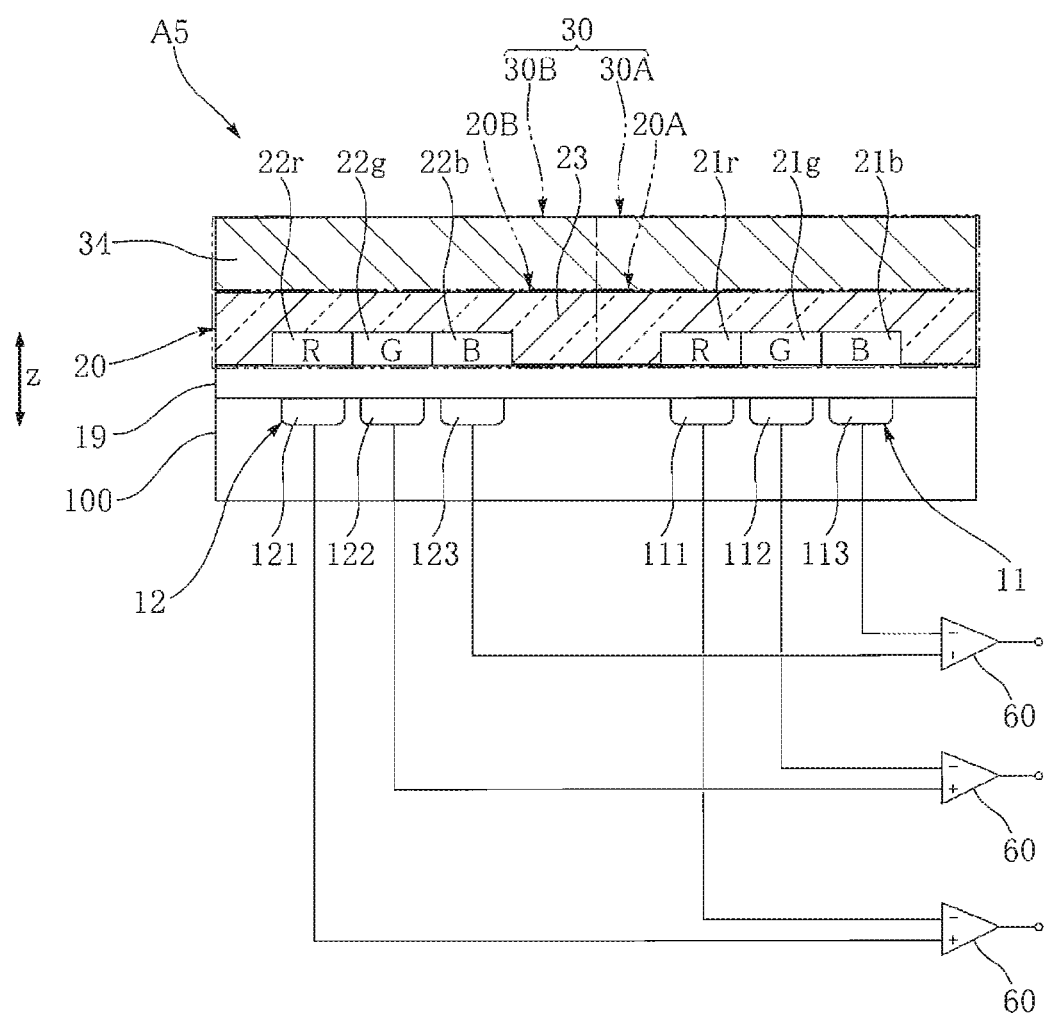
FIG. 5 is a brief configuration diagram of an illuminance sensor according to a third embodiment of the present invention.

FIG. 5 shows an illuminance sensor according to a third embodiment of the present invention. The illuminance sensor A5 shown in the drawing primary differs from the illuminance sensors A1 to A4 by the configurations of the first light receiving portion 11 and the second light receiving portion 12 and the configuration of the color filter layer 20. Further, in FIG. 5, only the second linear polarization plate 34 in the optical region 30 (the first optical region 30A and the second optical region 30B) is depicted, and the first linear polarization plate 31, the first quarter-wave plate 32 and the second quarter-wave plate 33 are omitted.

In the illuminance sensor A5 of this embodiment, the first light receiving portion 11 and the second light receiving portion 12 includes a plurality of light receiving elements, respectively. More specifically, the first light receiving portion 11 includes a first light receiving element 111, a second light receiving element 112 and a third light receiving element 113. The second light receiving portion 12 includes a first light receiving element 121, a second light receiving element 122 and a third light receiving element 123.

In this embodiment, a protective film 19 is formed on an IC 100, and the color filter layer 20 is formed on the protective film 19. The color filter layer 20 includes a first filter portion 20A disposed corresponding to the first light receiving portion 11, and a second filter portion 20B disposed corresponding to the second light receiving portion 12. The first filter portion 20A includes a first red light filter 21r, a first green light filter 20g and a first blue light filter 21b. The second filter portion 20B includes a second red filter 22r, a second green filter 22g and a second blue filter 22b.

The first red filter 21r and the second red filter 22r selectively attenuate light in wavelength regions of blue light and green light of a visible band, such that light in wavelength regions of red light and infrared light selectively pass through. The first red filter 21r covers the first light receiving element 111 in a direction (to be referred to as a z direction) orthogonal to light receiving surfaces of the first to third light receiving elements 111 to 113 or the first to third light receiving elements 121 to 123. The second red filter 22r covers the first light receiving element 121 in the z direction. In the drawings, the first red filter 21r and the second red filter 22r are denoted by the letter "R".

The first green filter 21b and the second green filter 22g selectively attenuate light in wavelength regions of red light and blue light of a visible band, such that light in wavelength regions of green light and infrared light selectively pass through. The first green filter 21g covers the second light receiving element 112 in the z direction. The second green filter 22g covers the second light receiving element 122 in the z direction. In the drawings, the first green filter 21g and the second green filter 22g are denoted by the letter "G".

The first blue filter 21b and the second blue filter 22b selectively attenuate light in wavelength regions of red light and green light of a visible band, such that light in wavelength regions of blue light and infrared light selectively pass through. The first blue filter 21b covers the third light receiving element 113 in the z direction. The second blue filter 22b covers the third light receiving element 123 in the z direction. In the drawings, the first blue filter 21b and the second blue filter 22b are denoted by the letter "B".

The filters 21r, 21g, 21b, 22r, 22g and 22b of the different colors may consist of, for example, color resist or gelatin films with pigments as a base. Further, in FIG. 5, thicknesses of the filters 21r, 21g, 21b, 22r, 22g and 22b of the different colors are substantially even. However, transmittances are different depending on different pigments of the filters of the different colors, and thus the thicknesses of the filters 21r, 21g, 21b, 22r, 22g and 22b of the different colors may be designed to be different according to characteristics of the filters of the different colors.

In this embodiment, the color filter layer 20 includes a protective film 23. The protective film 23 is disposed on the entire of the first filter portion 20A and the second filter portion 20B, the first filter portion 20A covers the entire of the first red filter 21r, the first green filter 20g and the first blue filter 21b, and the second filter portion 20B covers the entire of the second red filter 22r, the second green filter 22g and the second blue filter 22b. The protective film 23 includes, for example, a transparent resin such as titanium oxide ($TiO_2$).

The illuminance sensor A5 of this embodiment includes three difference detecting portions 60. One of the difference detecting portions 60 obtains a difference between outputs of the first light receiving portion 111 and the first light receiving element 121. Another of the difference detecting portions 60 obtains a difference between outputs of the second light receiving portion 112 and the second light receiving element 122. The remaining one of the difference detecting portions 60 obtains a difference between outputs of the third light receiving portion 113 and the third light receiving element 123.

Further, in FIG. 5, regarding the optical region 30 (the first optical region 30A and the second optical region 30B), description other than the second linear polarization plate 34 is omitted. The configurations of the first optical region 30A and the second optical region 30B (the first linear polarization plate 31, the first quarter-wave plate 32, the second quarter-wave plate 33 and the second linear polarization plate 34) may also be implemented by the configurations of those in any one of the illuminance sensors A1 to A4. Regardless of by which of the configurations of the illuminance sensors A1 to A4 the first optical region 30A and the second optical region 30B are implemented, the first light receiving portion 11 (the first light receiving element 111, the second light receiving element 112 and the third light receiving element 113) receives only infrared light, and the second light receiving portion 12 (the first light receiving element 121, the second light receiving element 122 and the third light receiving element 123) receives both infrared light and visible light.

The difference detecting portion 60 eliminates the infrared components from the light receiving amounts of the first light receiving portion 11 and the second light receiving portion 12 by means of obtaining the difference between the two light receiving portions 11 and 12, and outputs the light receiving amount of visible light as a signal. Further, in this embodiment, the first light receiving element 111, the second light receiving element 112 and the third light receiving element 113 of the first light receiving portion 11 are covered by the first red filter 21r, the first green filter 21g and the first blue filter 21b, respectively. Further, the first light receiving element 121, the second light receiving element 122 and the third light receiving element 123 of the second light receiving portion 12 are covered by the second red filter 22r, the second green filter 22g and the second blue filter 22b, respectively. Thus, the first light receiving portion 11 and the second light receiving portion 12 are capable of receiving a visible band in a manner of splitting the light into wavelength regions into red, green, and blue. Therefore, the illuminance sensor A5 of this embodiment is capable of eliminating or mitigating undesirable influences such as noise caused by infrared light, and performing illuminance detection of each of red, green and blue.

<Illuminance Sensor A6>

Figure 6:
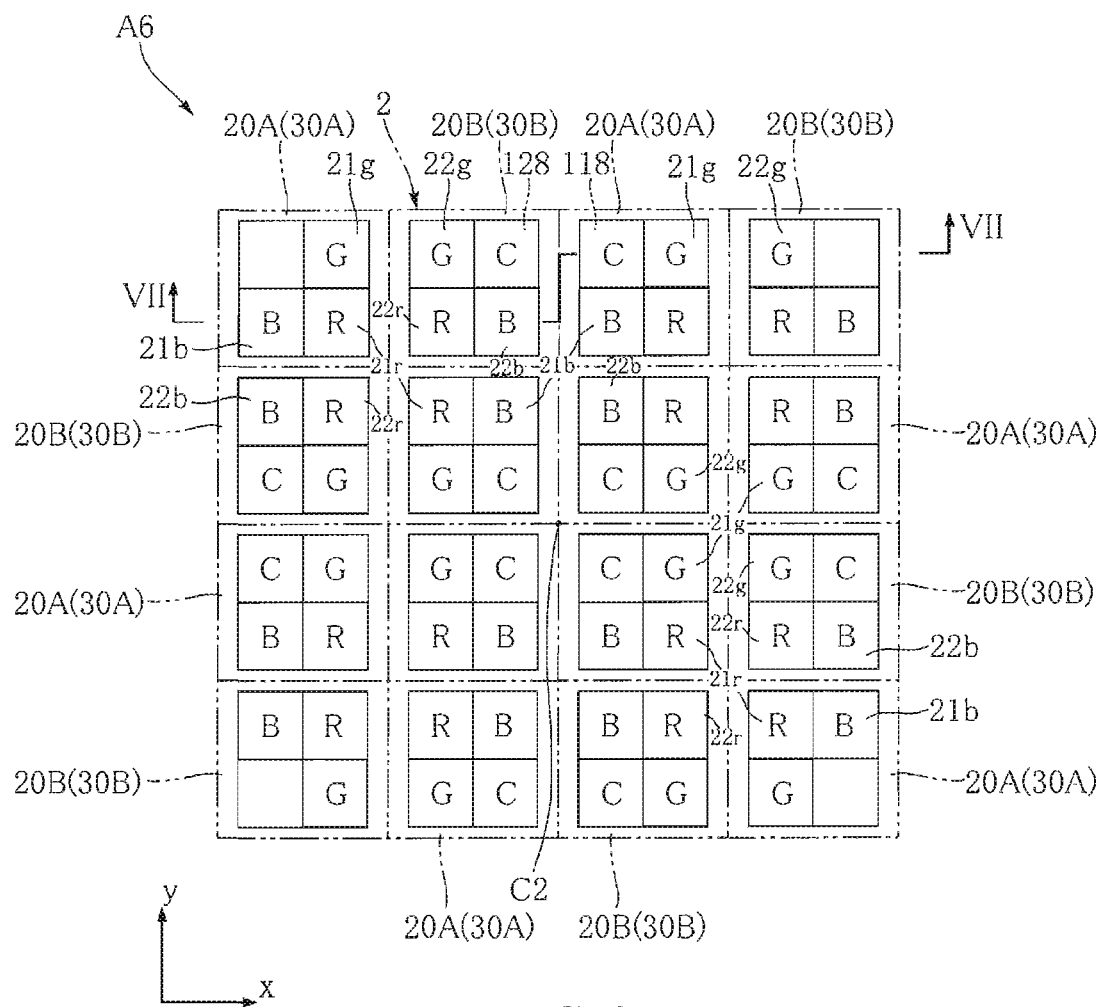
FIG. 6 is a top view of a brief configuration of an illuminance sensor according to a fourth embodiment of the present invention.
Figure 7:
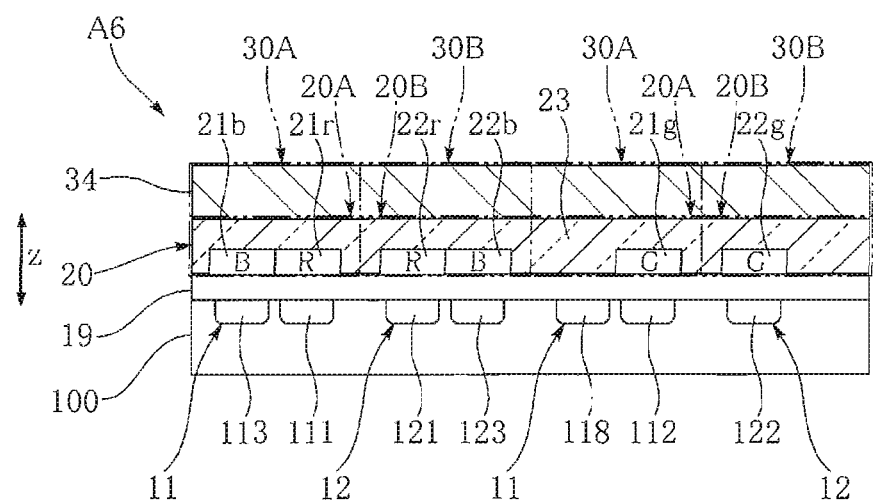
FIG. 7 is a section diagram along line VII-VII in FIG. 6.

FIG. 6 and FIG. 7 show an illuminance sensor according to a fourth embodiment of the present invention. The illuminance sensor A6 shown in the drawings includes a plurality of first light receiving portions 11 and a plurality of second light receiving portions 12, a plurality of first filter portions 20A and a plurality of second filter portions 20B, a plurality of first optical regions 30A and a plurality of second optical regions 30B, and a difference detecting portion 60 (omitted from the drawings).

Although associated details are omitted, each first light receiving portion 11, each second light receiving portion 12, each first filter portion 20A, each second filter portion 20B, each first optical region 30A and each second optical region 30B of this embodiment have identical configurations as the first light receiving portion 11, the second light receiving portion 12, the first filter portion 20A, the second filter portion 20B, the first optical region 30A and the second optical region 30B of the illuminance sensor A5, respectively. That is to say, in this embodiment, each first light receiving portion 11 includes the first light receiving element 111, the second light receiving element 112 and the third light receiving element 113, and each second light receiving portion 12 includes the first light receiving element 121, the second light receiving element 122 and the third light receiving element 123. Further, each first filter portion 20A includes the first red filter 21r covering the first light receiving element 111, the first green filter 21g covering the second light receiving element 112, and the first blue filter 21b covering the third light receiving element 113. Each second filter portion 20B includes the second red filter 22r covering the first light receiving element 121, the second green filter 22g covering the second light receiving element 122, and the second blue filter 22b covering the third light receiving element 123.

In this embodiment, it is understood according to FIG. 6 and FIG. 7 that, the first light receiving portion 11 and the second light receiving portion 12, the first filter portion 20A and the second filter portion 20B of the color filter layer 20, and the first optical region 30A and the second optical region 30B are alternately disposed in a matrix in an x direction (a first direction) and a y direction (a second direction) that are orthogonal to each other. In the examples shown, 8 first light receiving portions 11 and 8 second light receiving portions 12 totaling up to 16 first light receiving portions 11 and second light receiving portions 12 are disposed in a matrix of four rows and four columns in the x direction and the y direction. The first light receiving portion 11 and the second light receiving portion 12 are disposed alternately in any one of the x direction and the y direction. Further, 8 first filter portions 20A and 8 second filter portions 20B totaling up to 16 first filter portions 20A and second filter portions 20B are disposed in a matrix of four rows and four columns in the x direction and the y direction. The first filter portion 20A and the second filter portion 20B are disposed alternately in any of the x direction and the y direction. Similarly, 8 first optical regions 30A and 8 second optical regions 30B totaling up to 16 first optical regions 30A and second optical regions 30B are arranged in a matrix of four rows and four columns in the x direction and the y direction. The first optical region 30A and the second optical region 30B are disposed alternately in any of the x direction and the y direction. Further, as shown in FIG. 6, the 16 first filter portions 20A and the second filter portions 20B disposed in a matrix in a plane in the x direction and y direction to form a filter disposing region 2.

As shown in FIG. 6, in this embodiment, each first filter portion 20A and each second filter portion 20B are divided into two portions in the x direction and the y direction, respectively, into a total of four portions. In the first filter portion 20A, the first red filter 21r, the first green filter 21g and the first blue filter 21b are disposed in any one of the four divided portions. Similarly, in the second filter portion 20B, the second red filter 22r, the second green filter 22g and the second blue filter 22b are disposed in any one of the four divided portions.

In FIG. 6, zones of the first red filter 21r and the second red filter 22r are denoted by the letter "R", zones of the first green filter 21g and the second green filter 22g are denoted by the letter "G", and zones of the first blue filter 21b and the second blue filter 22b are denoted by the letter "B". Further, in the drawings, zones not denoted with any letter and zones denoted by the letter "C" are not disposed with any filters of the different colors. As shown in FIG. 7, the first light receiving portion 11 and the second light receiving portion 12 of this embodiment include light receiving elements for transparency 118 and 128, and the first filter portion 20A and the second filter portion 20B in zones denoted by the letter "C" are at positions corresponding to the light receiving elements for transparency 118 and 128.

As shown in FIG. 6, in the adjacent first filter portion 20A and second filter portion 20B, focusing on the first red filter 21r and the second red filter 22r, the first red filter 21r and the second red filter 22r are disposed adjacently in at least one of the x direction and the y direction. Similarly, in the adjacent first filter portion 20A and second filter portion focusing on the first green filter 21g and the second green filter 22g, the first green filter 21g and the second green filter 22g are disposed adjacently in at least one of the x direction and the y direction. Similarly, further, in the adjacent first filter portion 20A and second filter portion 20B, focusing on the first blue filter 21b and the second blue filter 22b, the first blue filter 21b and the second blue filter 22b are disposed adjacently in at least one of the x direction and the y direction.

As shown in FIG. 6, in this embodiment, in the filter disposing region 2 disposed with a plurality of first filter portions 20A and a plurality of second filter portions 20B, all the first red filters 21r and the second red filters 22r are disposed as being dot symmetric relative to the center C2 of the filter disposing region 2 as the center of symmetry. Similarly, all the first green filters 21g and second green filters 22g, and all the first blue filter 21b and second blue filters 22b are disposed as being dot symmetric relative to the center point C2 of the filter disposing region 2 as the center of symmetry.

Omitting detailed description on the drawings, in this embodiment, one difference detecting portion 60 obtains the difference between the outputs of the first light receiving element 111 and the first light receiving element 121 of the adjacent first light receiving portion 11 and second light receiving portion 12. Another difference detecting portion 60 obtains the difference between the outputs of the second light receiving element 112 and the second light receiving element 122 of the adjacent first light receiving portion 11 and second light receiving portion 12. Similarly, another difference detecting portion 60 obtains the difference between the outputs of the third light receiving element 113 and the third light receiving element 123 of the adjacent first light receiving portion 11 and second light receiving portion 12. Another difference detecting portion 60 obtains the difference between the outputs of the first light receiving element for transparency 118 and the second light receiving element for transparency 128 of the adjacent first light receiving portion 11 and second light receiving portion 12. As such, the difference detecting portions 60 are disposed in a manner of obtaining the differences between the outputs of the corresponding light element receiving pair in the adjacent first light receiving portion 11 and second light receiving portion 12.

Further, in FIG. 7, regarding the optical region 30 (the first optical region 30A and the second optical region 30B), description other than the second linear polarization plate 34 is omitted. The configurations of the first optical region 30A and the second optical region 30B (the first linear polarization plate 31, the first quarter-wave plate 32, the second quarter-wave plate 33 and the second linear polarization plate 34) may also be implemented by the configurations of those in any one of the illuminance sensors A1 to A4. Regardless of by which of the configurations of the illuminance sensors A1 to A4 the first optical region 30A and the second optical region 30B are implemented, the first light receiving portion 11 (the first light receiving element 111, the second light receiving element 112, the third light receiving element 113 and the light receiving element for transparency 118) receives only infrared light, and the second light receiving portion 12 (the first light receiving element 121, the second light receiving element 122, the third light receiving element 113 and the light receiving element for transparency 128) receives both infrared light and visible light.

The difference detecting portion 60 eliminates the infrared components from the light receiving amounts of the plurality of first light receiving portions 11 and the plurality of second light receiving portions 12 by means of obtaining the difference in the two light receiving portions 11 and 12, and outputs the light receiving amount of visible light as a signal. Further, in this embodiment, the first light receiving element 111, the second light receiving element 112 and the third light receiving element 113 of each first light receiving portion 11 are covered by the first red filter 21r, the first green filter 21g and the first blue filter 21b, respectively.

Further, the first light receiving element 121, the second light receiving element 122 and the third light receiving element 123 of each second light receiving portion 12 are covered by the second red filter 22r, the second green filter 22g and the second blue filter 22b, respectively. Thus, the plurality of first light receiving portions 11 and the plurality of second light receiving portions 12 are capable of receiving a visible band in a manner of splitting the light into wavelength regions into red, green, and blue. Therefore, the illuminance sensor A5 of this embodiment is capable of eliminating or mitigating undesirable influences such as noise caused by infrared light, and performing illuminance detection of each of red, green and blue.

Further, in this embodiment, in the adjacent first filter portion 20A and second filter portion 20B, the first red filter 21r and the second red filter 22r, the first green filter 21g and the second green filter 22g, and the first blue filter 21b and the second blue filter 22b are disposed adjacently in at least one of the x direction and the y direction, respectively. According to such configuration, light receiving element pairs obtaining the differences in the outputs so as to detect the illuminances of the components of red, green and blue are adjacent, hence enhancing illuminance detection accuracy for the colors.

Further, in the filter disposing region 2 disposed with a plurality of first filter portions 20A and a plurality of second filter portions 20B in a matrix, all the first red filters 21r and the second red filters 22r, all the first green filters 21g and second green filters 22g, and all the first blue filters 21b and second blue filters 22b are disposed as being dot symmetric relative to the center C2 of the filter disposing region 2 as the center of symmetry. According to such configuration, influences of non-uniform light amounts at different positions of an illuminance detection range, that is, the filter disposing region 2, of the illuminance sensor A6 may be suppressed, hence enhancing the illuminance detection accuracy each of red, green and blue.

<Illuminance Sensor A7>

Figure 8:
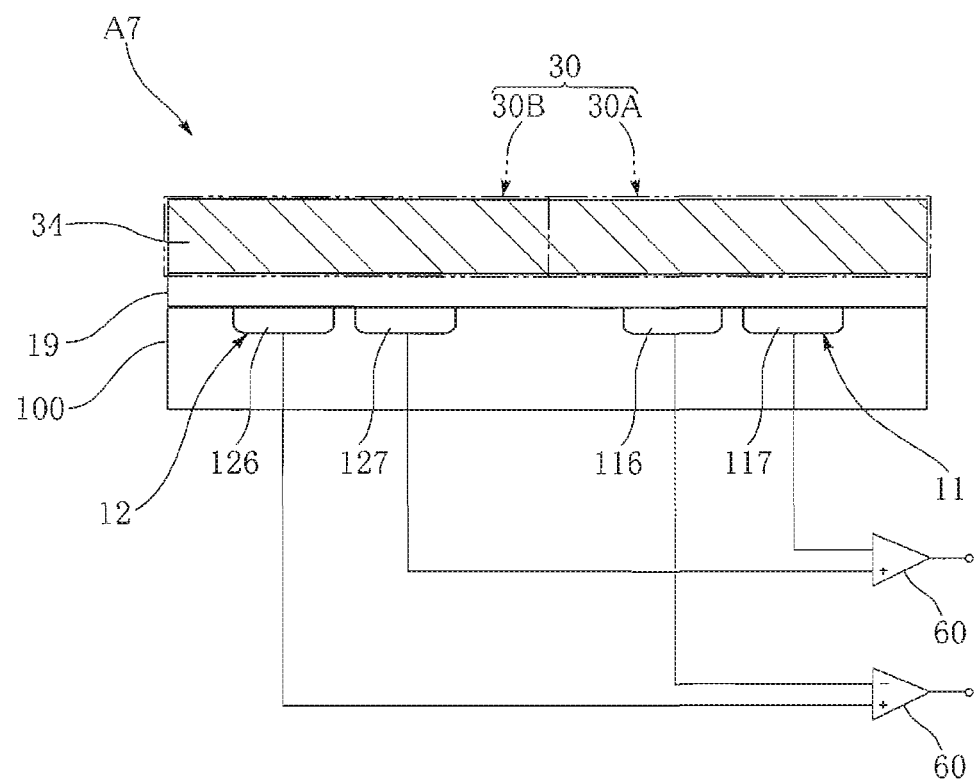
FIG. 8 is a brief configuration diagram of an illuminance sensor according to a fifth embodiment of the present invention.

FIG. 8 shows an illuminance sensor according to a fifth embodiment of the present invention. The illuminance sensor A7 shown in the drawing primary differs from the illuminance sensors A1 to A4 by the configurations of the first light receiving portion 11 and the second light receiving portion 12, and the configuration of the optical region 30 (the first optical region 30A and the second optical region 30B). Further, in FIG. 8, only the second linear polarization plate 34 in the optical region 30 (the first optical region 30A and the second optical region 30B) is depicted, and the first linear polarization plate 31, the first quarter-wave plate 32 and the second quarter-wave plate 33 are omitted.

In the description above, a situation below is illustrated: in the illuminance sensors A1 to A4 of the embodiments, at least any one of the first linear polarization plate 31 and the second linear polarization plate 34 has characteristics of providing a polarization function for an entire visible band, and not polarizing but allowing passing through of an entire infrared band. In contrast, in this embodiment, at least any one of the first linear polarization plate 31 and the second linear polarization plate 34 has the following characteristics: providing a polarization function for an entire visible band, providing a polarization function for a portion of an infrared band, and not polarizing but allowing passing through of the remaining band of the infrared band. In this case, if a difference between outputs of the first light receiving portion 11 and the second light receiving portion 12 is received, a portion of infrared components is included as noise.

In the illuminance sensor A7 of this embodiment, the first light receiving portion 11 and the second light receiving portion 12 include a plurality of light receiving elements, respectively. The first light receiving portion 11 includes a light receiving element for visible light 116 having a sensing peak in a visible band, and a light receiving element for infrared light 117 having a sensing peak in an infrared band. The second light receiving portion 12 includes a light receiving element for visible light 126 having a sensing peak in a visible band, and a light receiving element for infrared light 127 having a sensing peak in an infrared band. Further, in this embodiment, different from the foregoing embodiments, the color filter layer 20 is not included.

The illuminance sensor A7 of this embodiment includes two difference detecting portions 60. One of the difference detecting portions 60 obtains a difference between outputs of the light receiving element for visible light 116 and the light receiving element for visible light 126. The other of the difference detecting portions 60 obtains a difference between outputs of the light receiving element for infrared light 117 and the light receiving element for infrared light 127.

Further, in FIG. 8, regarding the optical region 30 (the first optical region 30A and the second optical region 30B), description other than the second linear polarization plate 34 is omitted. The configurations of the first optical region 30A and the second optical region 30B (the first linear polarization plate 31, the first quarter-wave plate 32, the second quarter-wave plate 33 and the second linear polarization plate 34) may also be implemented by the configurations of those in any one of the illuminance sensors A1 to A4. Regardless of by which of the configurations of the illuminance sensors A1 to A4 the first optical region 30A and the second optical region 30B are implemented, the first light receiving portion 11 (the light receiving element for visible light 116 and the light receiving element for infrared light 117) receives only a portion of infrared light (an ineffective band), and the second light receiving portion 12 (the light receiving element for visible light 126 and the light receiving element for infrared light 127) receives both infrared light and visible light.

The difference detecting portion 60 obtains a difference between the first light receiving portion 11 and the second light receiving portion 12 (the light receiving element for visible light 116 and the light receiving element for infrared light 117, and the light receiving element for visible light 126 and the light receiving element for infrared light 127), and outputs the light receiving amount of the visible band and the light receiving amount of a portion of infrared components as a signal. Therefore, the illuminance sensor A7 according this embodiment is capable of eliminating or mitigating undesirable influences such as noise caused by infrared light and performing illuminance detection.

<Illuminance Sensor A8>

Figure 9:
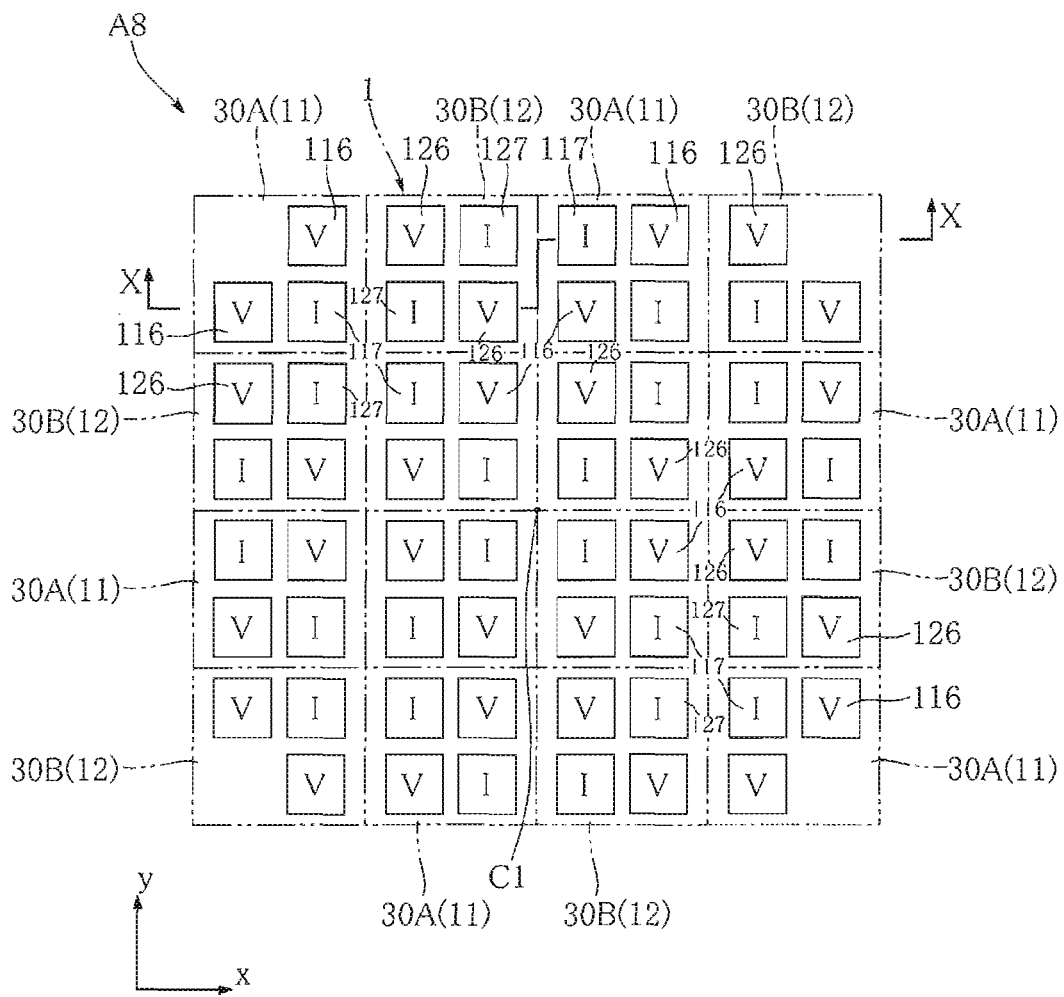
FIG. 9 is a top view of a brief configuration of an illuminance sensor according to a sixth embodiment of the present invention.
Figure 10:
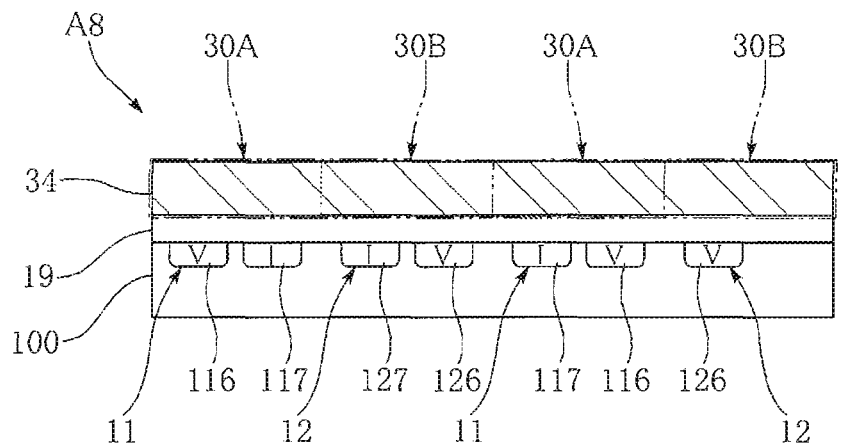
FIG. 10 is a section diagram along line X-X in FIG. 9.

FIG. 9 and FIG. 10 show an illuminance sensor according to a sixth embodiment of the present invention. The illuminance sensor A8 shown in the drawings includes a plurality of first light receiving portions 11 and a plurality of second light receiving portions 12, a plurality of first optical regions 30A and a plurality of second optical regions 30B, and a difference detecting portion 60 (omitted from the drawings).

Although associated details are omitted, each first light receiving portions 11, each second light receiving portion 12, each first optical region 30A and each second optical region 30B of this embodiment have identical configurations as the first light receiving portion 11, the second light receiving portion 12, the first optical region 30A and the second optical region 30B of the illuminance sensor A5, respectively. That is to say, each first light receiving portion 11 includes the light receiving element for visible light 116 and the light receiving element for infrared light 117, and each second light receiving portion 12 includes the light receiving element for visible light 126 and the light receiving element for infrared light 127.

In this embodiment, it is understood according to FIG. 9 and FIG. 10 that, the first light receiving portion 11 and the second light receiving portion 12, and the first optical region 30A and the second optical region 30B are alternately disposed in a matrix in the x direction (the first direction) and the y direction (the second direction) that are orthogonal to each other. In the examples shown, 8 first light receiving portions 11 and 8 second light receiving portions 12 totaling up to 16 first light receiving portions 11 and second light receiving portions 12 are disposed in a matrix of four rows and fourth columns in the x direction and the y direction. The first light receiving portion 11 and the second light receiving portion 12 are disposed alternately in any one of the x direction and the y direction. Similarly, 8 first optical regions 30A and 8 second optical regions 30B totaling up to 16 first optical regions 30A and second optical regions 30B are arranged in a matrix of four rows and four columns in the x direction and the y direction. The first optical region 30A and the second optical region 30B are disposed alternately in any of the x direction and the y direction. Further, as shown in FIG. 9, the 16 first light receiving portions 11 and second light receiving portions 12 disposed in a matrix in a plane in the x direction and y direction form a light receiving portion disposing region 1.

Further, in FIG. 9 and FIG. 10, the light receiving element for visible light 116 and light receiving element for visible light 126 are denoted by the letter "V", and the light receiving element for infrared light 117 and the light receiving element for infrared light 127 are denoted by the letter "I". As shown in FIG. 9, in the first light receiving portion 11 and the second light receiving portion 12 adjacent to each other, focusing on the light receiving element for visible light 116 and light receiving element for visible light 126, the light receiving element for visible light 116 and light receiving element for visible light 126 are disposed adjacently in at least any one of the x direction and the y direction. Similarly, in the first light receiving portion 11 and the second light receiving portion 12 adjacent to each other, focusing on the light receiving element for infrared light 117 and light receiving element for infrared light 127, the light receiving element for infrared light 117 and light receiving element for infrared light 127 are disposed adjacently in at least any one of the x direction and the y direction.

As shown in FIG. 9, in this embodiment, in the filter disposing region 1 disposed with a plurality of first light receiving portions 11 and a plurality of second light receiving portions 12 in a matrix, all light receiving elements for visible light 116 and light receiving elements for visible light 126 are disposed as being dot symmetric relative to the center C1 of the light receiving portion disposing region 1 as the center of symmetry. Similarly, all the light receiving elements for infrared light 117 and the light receiving elements for infrared light 127 are disposed as being dot symmetric relative to the center C1 of the light receiving portion disposing region 1 as the center of symmetry.

Omitting detailed description on the drawings, in this embodiment, one difference detecting portion 60 obtains the difference in the outputs of the light receiving element for visible light 116 and light receiving element for visible light 126 of the adjacent first light receiving portion 11 and second light receiving portion 12. The other difference detecting portion 60 obtains the difference in the outputs of the light receiving element for infrared light 117 and the light receiving element for infrared light 127 of the adjacent first light receiving portion 11 and second light receiving portion 12. As such, the difference detecting portions 60 are disposed in a manner of obtaining the differences between the outputs of the corresponding light element receiving pair in the adjacent first light receiving portion 11 and second light receiving portion 12.

Further, in FIG. 10, regarding the optical region 30 (the first optical region 30A and the second optical region 30B), description other than the second linear polarization plate 34 is omitted. The configurations of the first optical region 30A and the second optical region 30B (the first linear polarization plate 31, the first quarter-wave plate 32, the second quarter-wave plate 33 and the second linear polarization plate 34) may also be implemented by the configurations of those in any one of the illuminance sensors A1 to A4. Regardless of by which of the configurations of the illuminance sensors A1 to A4 the first optical region 30A and the second optical region 30B are implemented, the first light receiving portion 11 (the light receiving element for visible light 116 and the light receiving element for infrared light 117) receives only a portion of infrared light (an ineffective band), and the second light receiving portion 12 (the light receiving element for visible light 126 and the light receiving element for infrared light 127) receives both infrared light and visible light.

The difference detecting portion 60 receives the difference between the plurality of first light receiving portions 11 and the plurality of second light receiving portions 12, and outputs the light receiving amount of the visible band and the light receiving amount of a portion of the band of the infrared components as a signal. Therefore, the illuminance sensor A7 according this embodiment is capable of eliminating or mitigating undesirable influences such as noise caused by infrared light and performing illuminance detection.

Further, in this embodiment, in the first light receiving portion 11 and the second light receiving portion 12 adjacent to each other, the light receiving element for visible light 116 of the first light receiving portion 11 and the light receiving portion for visible light 126 of the second light receiving portion 12, and the light receiving portion for infrared light 117 for the first light receiving portion 11 and the light receiving portion for infrared light 127 of the second light receiving portion are disposed adjacently at least any one of the x direction and the y direction. According to such configuration, the light receiving element pairs obtaining the differences in outputs so as to perform illuminance detection are adjacent, hence enhancing illuminance detection accuracy.

Further, in the light receiving portion disposing region 1 disposed with a plurality of first light receiving portions 11 and a plurality of second light receiving portions 12 in a matrix, all light receiving elements for visible light 116 and light receiving elements for visible light 126, and all the light receiving elements for infrared light 117 and light receiving elements for infrared light 127 are disposed as being dot symmetric relative to the center C1 of the light receiving portion disposing region 1 as the center of symmetry. According to such configuration, influences of non-uniform light receiving amounts at different positions of an illuminance detection range, that is, the light receiving portion disposing region 1, of the illuminance sensor A8 may be suppressed, thereby enhancing the illuminance detection accuracy.

<Two-Dimensional (2D) Image Sensor 70>

Figure 11:
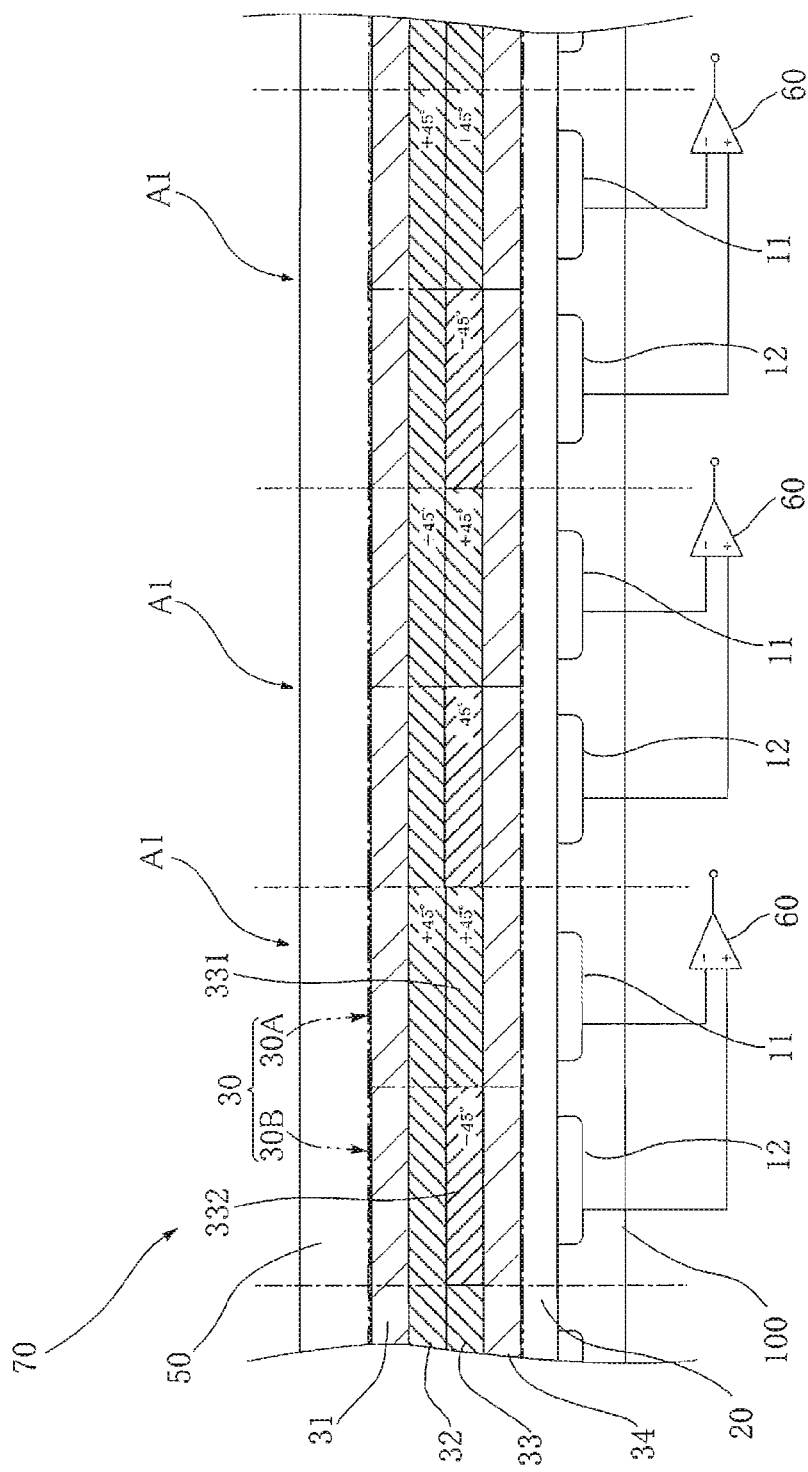
FIG. 11 is a brief configuration diagram of a two-dimensional (2D) image sensor according to an embodiment of the present invention.

FIG. 11 shows a 2D image sensor 70 using the configuration of the illuminance sensor A1. Further, the configuration of the illuminance sensor used by the 2D image sensor may be any of the configurations of the illuminance sensors A1 to A4, A5 and A7.

The 2D image sensor 70 uses the configuration in FIG. 1 as one unit, and disposes a plurality of such unit into a plurality columns and a plurality of rows inside a transparent optical window 50. The 2D image sensor 70 may be a contact-type or a non-contact type. When the 2D image sensor 70 is a non-contact type, a 2D image is projected to the optical window by an optical lens (not shown).

The functions of the illuminance sensor A1 forming the pixel units are as described with reference to FIG. 1, that is, eliminating or mitigating noise produced by infrared light in pixel information under detection.

<Electronic Machine 1>

Figure 12:
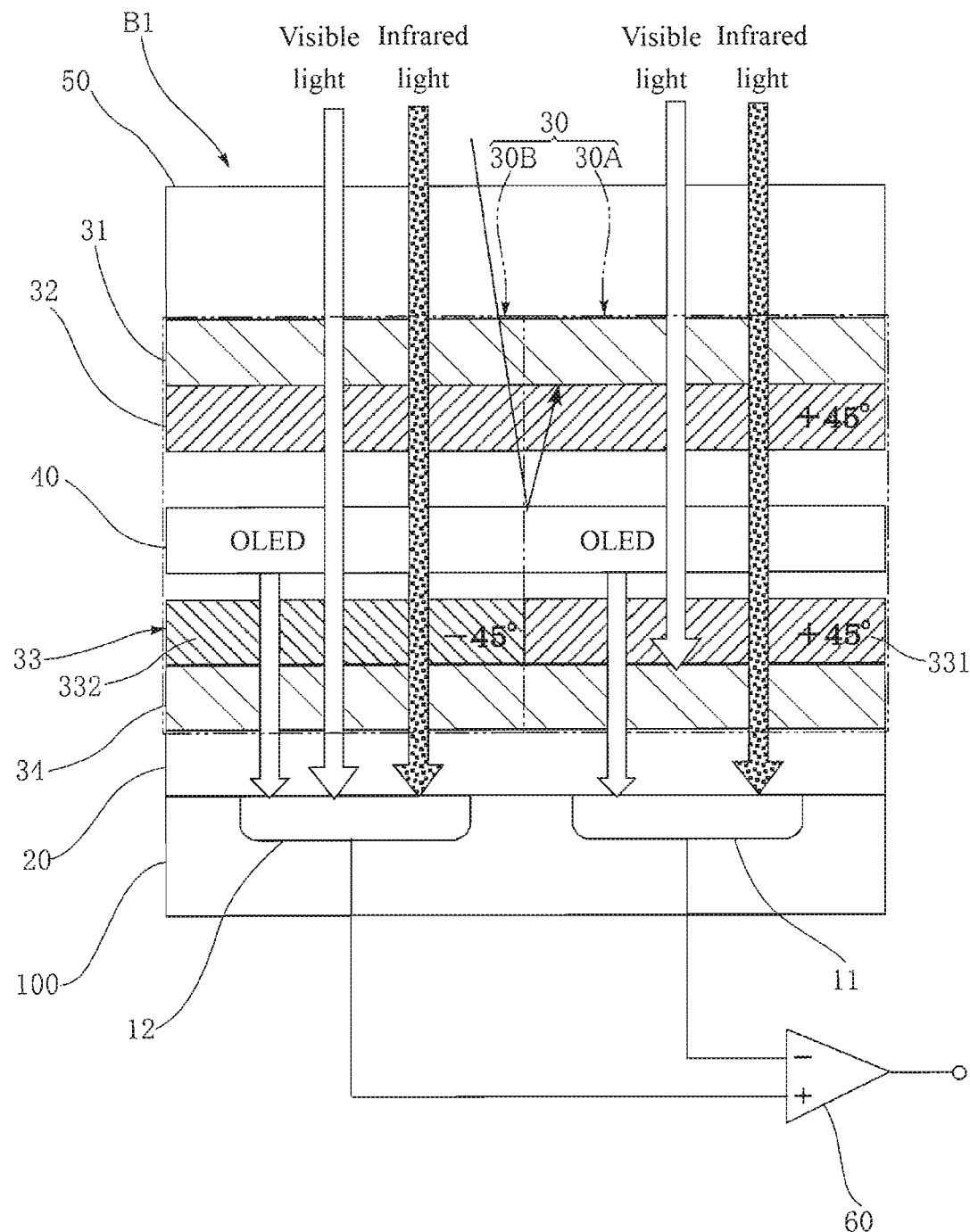
FIG. 12 is a brief configuration diagram of an electronic machine according to the first embodiment of the present invention.

FIG. 12 shows an electronic machine B1 as an electronic machine according to the first embodiment of the present invention. The electronic machine B1 includes an OLED the first light receiving portion 11, the second light receiving portion 12, the optical region 30 and the difference detecting portion 60.

The first light receiving portion 11 and the second light receiving portion 12 are disposed on the side of a back surface of the OLED 40, for example, manufactured and incorporated into a photodiode of the same IC 100 and located in the same plane serving as the main surface of the IC 100. The optical region 30 is disposed opposite to the first light receiving portion 11 and the second light receiving portion 12. The optical region 30 has a first optical region 30A disposed corresponding to the first light receiving portion 11, and a second optical region 30B disposed corresponding to the second light receiving portion 12.

The optical region 30 (the first optical region 30A and the second optical region 30B) includes a first linear polarization plate 31, a first quarter-wave plate 32, a second quarter-wave plate 33, and a second linear polarization plate 34. In this embodiment, the first quarter-wave plate 32 and the first linear polarization plate 31 are sequentially disposed on the side of the observe surface of the OLED 40, and the second quarter-wave plate 33 and the second linear polarization plate 34 are sequentially disposed at the back surface of the OLED 40.

In this embodiment, the optical window 50 serving as the electronic machine B1 consists of the first linear polarization plate 31 and the first quarter-wave plate 32 deposited on the side of the back surface of the transparent window material. The first linear polarization plate 31 is similarly disposed in the entire of the first optical region 30A and the second optical region 30B (the regions corresponding to the first light receiving portion 11 and the region corresponding to the second light receiving portion 12). In the entire of the first optical region 30A and the second optical region 30B (the regions corresponding to the first light receiving portion 11 and the region corresponding to the second light receiving portion 12), the slow axis of the first quarter-wave plate has a relation of +45° or −45° in regard to the polarization direction (the first polarization direction) of the first linear polarization plate 31. In this embodiment, the slow axis of the first quarter-wave plate 32 has a relation of +45° in regard to the first polarization direction, and is denoted by "+45°" in FIG. 12.

The first light receiving portion 11 and the second light receiving portion 12 are located in the same plane parallel to the OLED 40. In this embodiment, further, the second quarter-wave plate 33 and the second linear polarization plate 34 are used as an integral body manufactured and incorporated with the first light receiving portion 11 and the second light receiving portion 12, and is deposited and formed on the main surface of the OLED 40. Further, in this embodiment, the color filter layer 20 of such as red, green or blue is interposed between the first light receiving portion 11 and the second light receiving portion 12 and the second linear polarization plate 34.

The second linear polarization plate 34 is similarly disposed in the entire of the first optical region 30A and the second optical region 30B (the regions corresponding to the first light receiving portion 11 and the region corresponding to the second light receiving portion 12). In this embodiment, the polarization direction (the first polarization direction) of the first linear polarization plate 31 is the same with the polarization direction (the second polarization direction) of the second linear polarization plate 34, and is represented by slant shading lines in the same direction in FIG. 12. Further, at least any one of the first linear polarization plate 31 and the second linear polarization plate 34 is implemented by a polarization plate in which an ineffective band includes at least a portion of an infrared band. Herein, an ineffective band refers to a wavelength band of light that does not effectively perform polarization. That is to say, at least any one of the first linear polarization plate 31 and second linear polarization plate 34 is implemented by, for example, a polarization plate of the following characteristics: the polarization plate has a polarization function for an entire visible band, and does not polarize but allows passing through of an entire infrared band. For example, a polarization plate "MCPR-4" sold by MeCan Imaging Inc. may be used as a linear polarization plate of the foregoing characteristics.

The second quarter-wave plate 33 has a first portion 331 in the first optical region 30A and a second portion 332 in the second optical region 30B. The relation of a slow axis of the first portion 331 in regard a polarization direction (a second polarization direction) of the second linear polarization plate 34 is the same with the relation of the slow axis of the first quarter-wave plate 32 in regard to the polarization direction (the first polarization direction) of the first linear polarization plate 31, that is, +45° or −45°. In this embodiment, the polarization direction (the first polarization direction) of the first linear polarization plate 33 is the same with the polarization direction (the second polarization direction) of the second linear polarization plate 34, and thus the slow axis of the first portion 331 also has a relation of +45° in regard to the first polarization direction, is denoted as "+45°'" in FIG. 12. On the hand, a relation of a slow axis of the second portion 332 in regard to the polarization direction (the second polarization direction) of the second linear polarization plate 34 is opposite in sign to the relation of the slow axis of the first quarter-wave plate 32 in regard to the polarization direction (the first polarization direction) of the first linear polarization plate 31. In this embodiment, the slow axis of the second portion 332 has a relation of −45° in regard to the second polarization direction. Further, in this embodiment, the polarization direction (the first polarization direction) of the first linear polarization plate 31 is the same with the polarization direction (the second polarization direction) of the second linear polarization plate 34, and thus the slow axis of the second portion 332 also has a relation of −45° in regard to the first polarization direction, is denoted by "−45°'" in FIG. 12.

The difference detecting portion 60 obtains a difference between an output of the first light receiving portion 11 and an output of the second light receiving portion 12. The different detecting portion 60 may be implemented by, for example, a differential amplifier such as an operational amplifier.

Further, the electronic machine in which a display portion consists of the OLED disposed inside the foregoing optical window 50 is, for example, a portable information terminal such as a smartphone, a television, or a personal computer display.

Next, the functions of the electronic machine B1 shown in FIG. 12 are described individually below, for when the ineffective bands of both the first linear polarization plate 31 and the second linear polarization plate 34 include the infrared band, when the ineffective band of only the first linear polarization plate 31 between the first linear polarization plate 31 and the second linear polarization plate 34 includes the infrared band, and when the ineffective band of only the second linear polarization plate 34 between the first linear polarization plate 31 and the second linear polarization plate 34 includes the infrared band.

[When the Ineffective Bands of Both the First Linear Polarization Plate 31 and the Second Linear Polarization Plate 34 Include the Infrared Band]

In external light (visible light) entering from the optical window 50, regarding reflected light formed by an electrode (omitted from the drawing) of the OLED 40, circularly polarized light formed by the first linear polarization plate 31 and the first quarter-wave plate 32 is reflected by the electrode (omitted from the drawing) of the OLED 40 to become reversely turned circularly polarized light, and again enters the first quarter-wave plate 32 from the back surface. The reversely turned circularly polarized light becomes, when passing through the first quarter-wave plate 32 from the side of the back surface, polarized light differing by 90° in regard to the polarization direction of the first linear polarization plate 31. Therefore, the polarized light is incapable of passing through the first linear polarization plate 31, and is incapable of exiting from the optical window 50. That is to say, the light reflected by the electrode in the OLED 40 in the external light (visible light) entering from the optical window 50 is prohibited or suppressed from exiting to the exterior of the optical window 50.

A portion of the light emitted from the OLED 40 faces the second quarter-wave plate 33 from the side of the back surface of the OLED 40. The exiting light from the side of the back surface of the OLED 40 passes through the first portion 331 of the second quarter-wave plate 33 in the first optical region 30A (the region corresponding to the first light receiving portion 11), is polarized by the second linear polarization plate 34 and arrives at the first light receiving portion 11. Similarly for the second optical region 30B (the region corresponding to the second light receiving portion 12), the exiting light from the side of the back surface of the OLED 40 passes through the second portion 332 of the second quarter-wave plate 33, is polarized by the second linear polarization plate 34 and arrives at the second light receiving portion 12.

Neither of the first linear polarization plate 31 and the second linear polarization plate 34 has a polarization function for infrared light, and thus neither of the first light receiving portion 11 and the second light receiving portion 12 is capable of receiving infrared light.

On the other hand, regarding visible light, in the first optical region 30A (the region corresponding to the first light receiving portion 11), linearly polarized light passing through the first linear polarization plate 31 becomes circularly polarized light by the first quarter-wave plate 32)(+45°.

As described above, the relation of the slow axis of the first portion 331)(+45° of the second quarter-wave plate 33 in regard to the polarization direction (the second polarization direction) of the second linear polarization plate 34 is the same with the relation of the slow axis of the first quarter-wave plate 32 in regard to the polarization direction (the first polarization direction) of the first linear polarization plate, that is, +45°. Therefore, the circularly polarized light formed by the first linear polarization plate 31 and the first quarter-wave plate 32 is incapable of passing through the second linear polarization plate 34. That is to say, the first light receiving portion 11 does not receive visible light from the exterior, but receives infrared light and light from the OLED 40.

Regarding visible light, in the second optical region 30B (the region corresponding to the second light receiving portion 12), the linearly polarized light passing through the first linear polarization plate 31 becomes circularly polarized light by the first quarter-wave plate)(+45°. As described, the relation of the slow axis of the second portion 332)(−45° of the second quarter-wave plate 33 in regard to the polarization direction (the second polarization direction) of the second linear polarization plate 34 is −45° that is opposite in sign to the relation of the slow axis of the first quarter-wave plate 32 in regard to the polarization direction (the first polarization direction) of the first linear polarization plate 31. Therefore, the circularly polarized light formed by the first linear polarization plate 31 and the first quarter-wave plate 32 is capable of passing through the second linear polarization plate 34 and arriving at the second light receiving portion 12. That is to say, the second light receiving portion 12 receives infrared light, visible light from the exterior, and light from the OLED 40.

The difference detecting portion 60 eliminates the infrared components from the light receiving amounts and the components of light from the OLED 40 of the first light receiving portion 11 and the second light receiving portion 12 by means of obtaining the difference between the two light receiving portions 11 and 12, and outputs the light receiving amount of visible light from the exterior as a signal. Therefore, the electronic machine B1 is capable of eliminating or mitigating undesirable influences such as noise caused by infrared light or light from the OLED 40, and performing illuminance detection.

[When the Ineffective Band of Only the First Linear Polarization Plate 31 Between the First Linear Polarization Plate 31 and the Second Linear Polarization Plate 34 Includes the Infrared Band]

In terms of prohibiting or suppressing the light reflected by the electrode of the OLED 40 in the external light (visible light) entering from the optical window 50 from exiting the optical window 50, associated details are the same with the description given for when effective bands of both the first linear polarization plate 31 and the second linear polarization 34 include the visible band.

The exiting light from the side of the back surface of the OLED 40 passes through the second quarter-wave plate 33 (the first portion 331) in the first optical region 30A (the region corresponding to the first light receiving portion 11), is polarized by the second linear polarization plate 34 and arrives at the first light receiving portion 11. Similarly for the second optical region 30B (the region corresponding to the second light receiving portion 12), the exiting light from the side of the back surface of the OLED 40 passes through the second quarter-wave plate 33 (the second portion 332), is polarized by the second linear polarization plate 34 and arrives at the second light receiving portion 12.

Regarding infrared light, in the first optical region 30A (the region corresponding to the first light receiving portion 11), the first linear polarization plate 31 does not have a polarization function, and thus the infrared light directly passes through the first linear polarization plate 31, the first quarter-wave plate 32 and the second quarter-wave plate 33. Infrared light arriving at the second linear polarization plate 34 is polarized by the second linear polarization plate 34, and arrives at the first light receiving portion 11.

Regarding infrared light, in the second optical region 30B (the region corresponding to the second light receiving portion 12), the first linear polarization plate 31 likewise does not have a polarization function, and thus the infrared light directly passes through the first linear polarization plate 31, the first quarter-wave plate 32 and the second quarter-wave plate 33. The infrared light arriving at the second linear polarization plate 34 is polarized by the second linear polarization plate 34, and arrives at the second light receiving portion 12.

Regarding infrared light, the first light receiving portion 11 and the second light receiving portion 12 similarly receive the infrared light.

Regarding visible light, in the first optical region 30A (the region corresponding to the first light receiving portion 11), the linearly polarized light passing through the first linear polarization plate 31 becomes circularly polarized light by the first quarter-wave plate 32)(+45°. As described above, the relation of the slow axis of the first portion 331)(+45° of the second quarter-wave plate 33 in regard to the polarization direction (the second polarization direction) of the second linear polarization plate 34 is the same with the relation of the slow axis of the first quarter-wave plate 32 in regard to the polarization direction (the first polarization direction) of the first linear polarization plate, that is, +45°. Therefore, the circularly polarized light formed by the first linear polarization plate 31 and the first quarter-wave plate 32 is incapable of passing through the second linear polarization plate 34. That is to say, the first light receiving portion 11 does not receive visible light from the exterior, but receives infrared light and light from the OLED 40.

Regarding visible light, in the second optical region 30B (the region corresponding to the second light receiving portion 12), the linearly polarized light passing through the first linear polarization plate 31 becomes circularly polarized light by the first quarter-wave plate)(+45°. As described, the relation of the slow axis of the second portion 332)(−45° of the second quarter-wave plate 33 in regard to the polarization direction (the second polarization direction) of the second linear polarization plate 34 is −45° that is opposite in sign to the relation of the slow axis of the first quarter-wave plate 32 in regard to the polarization direction (the first polarization direction) of the first linear polarization plate 31. Therefore, the circularly polarized light formed by the first linear polarization plate 31 and the first quarter-wave plate 32 is capable of passing through the second linear polarization plate 34 and arriving at the second light receiving portion 12. That is to say, the second light receiving portion 12 receives infrared light, visible light from the exterior, and light from the OLED 40.

The difference detecting portion 60 eliminates the infrared components from the light receiving amounts and the components of light from the OLED 40 of the first light receiving portion 11 and the second light receiving portion 12 by means of obtaining the difference between the two light receiving portions 11 and 12, and outputs the light receiving amount of visible light from the exterior as a signal. Therefore, the electronic machine B1 is capable of eliminating or mitigating undesirable influences such as noise caused by infrared light or light from the OLED 40, and performing illuminance detection.

[When the Ineffective Band of Only the Second Linear Polarization Plate 34 Between the First Linear Polarization Plate 31 and the Second Linear Polarization Plate 31 Includes the Infrared Band]

In terms of prohibiting or suppressing the light reflected by the electrode of the OLED 40 in the external light (visible light) entering from the optical window 50 from exiting the optical window 50, associated details are the same with the description given for when effective bands of both the first linear polarization plate 31 and the second linear polarization 34 include the visible band.

The exiting light from the side of the back surface of the OLED 40 passes through the second quarter-wave plate 33 (the first portion 331) in the first optical region 30A (the region corresponding to the first light receiving portion 11), is polarized by the second linear polarization plate 34 and arrives at the first light receiving portion 11. Similarly for the second optical region 30B (the region corresponding to the second light receiving portion 12), the exiting light from the side of the back surface of the OLED 40 passes through the second quarter-wave plate 33 (the second portion 332), is polarized by the second linear polarization plate 34 and arrives at the second light receiving portion 12.

Regarding infrared light, in the first optical region 30A (the region corresponding to the first light receiving portion 11), the infrared light is polarized at the first linear polarization plate 31, and the direction of the polarized light changes by 90° in a period of passing through the first quarter-wave plate 32 and the second quarter-wave plate 33 (the first portion 331). The second linear polarization plate 34 does not have a polarization function for infrared light, and thus the polarized light changed by 90° in direction directly arrives at the first light receiving portion 11.

Regarding infrared light, in the second optical region 30B (the region corresponding to the second light receiving portion 12), the infrared light is also polarized at the first linear polarization plate 31, and arrives at the second linear polarization plate 34 in a manner that the polarization direction thereof is not changed at timings of passing through the first quarter-wave plate 32 and the second quarter-wave plate 33 (the second portion 332). The second linear polarization plate 34 does not have a polarization function for infrared light, and thus the polarized light generated by the first linear polarization plate 31 directly arrives at the second light receiving portion 12.

That is to say, regarding infrared light, the first light receiving portion 11 and the second light receiving portion 12 receive the infrared light by the same light amount for polarized light of a phase difference of 90°.

Regarding visible light, in the first optical region 30A (the region corresponding to the first light receiving portion 11), the linearly polarized light passing through the first linear polarization plate 31 becomes circularly polarized light by the first quarter-wave plate 32)(+45°. As described above, the relation of the slow axis of the first portion 331)(+45° of the second quarter-wave plate 33 in regard to the polarization direction (the second polarization direction) of the second linear polarization plate 34 is the same with the relation of the slow axis of the first quarter-wave plate 32 in regard to the polarization direction (the first polarization direction) of the first linear polarization plate, that is, +45°. Therefore, the circularly polarized light formed by the first linear polarization plate 31 and the first quarter-wave plate 32 is incapable of passing through the second linear polarization plate 34. That is to say, the first light receiving portion 11 does not receive visible light from the exterior, but receives infrared light and light from the OLED 40.

Regarding visible light, in the second optical region 30B (the region corresponding to the second light receiving portion 12), the linearly polarized light passing through the first linear polarization plate 31 becomes circularly polarized light by the first quarter-wave plate)(+45°. As described, the relation of the slow axis of the second portion 332)(−45° of the second quarter-wave plate 33 in regard to the polarization direction (the second polarization direction) of the second linear polarization plate 34 is −45° that is opposite in sign to the relation of the slow axis of the first quarter-wave plate 32 in regard to the polarization direction (the first polarization direction) of the first linear polarization plate 31. Therefore, the circularly polarized light formed by the first linear polarization plate 31 and the first quarter-wave plate 32 is capable of passing through the second linear polarization plate 34 and arriving at the second light receiving portion 12. That is to say, the second light receiving portion 12 receives infrared light, visible light from the exterior, and light from the OLED 40.

The difference detecting portion 60 eliminates the infrared components from the light receiving amounts and the components of light from the OLED 40 of the first light receiving portion 11 and the second light receiving portion 12 by means of obtaining the difference between the two light receiving portions 11 and 12, and outputs the light receiving amount of visible light from the exterior as a signal. Therefore, the electronic machine B1 is capable of eliminating or mitigating undesirable influences such as noise caused by infrared light or light from the OLED 40, and performing illuminance detection.

<Electronic Machine B2>

Figure 13:
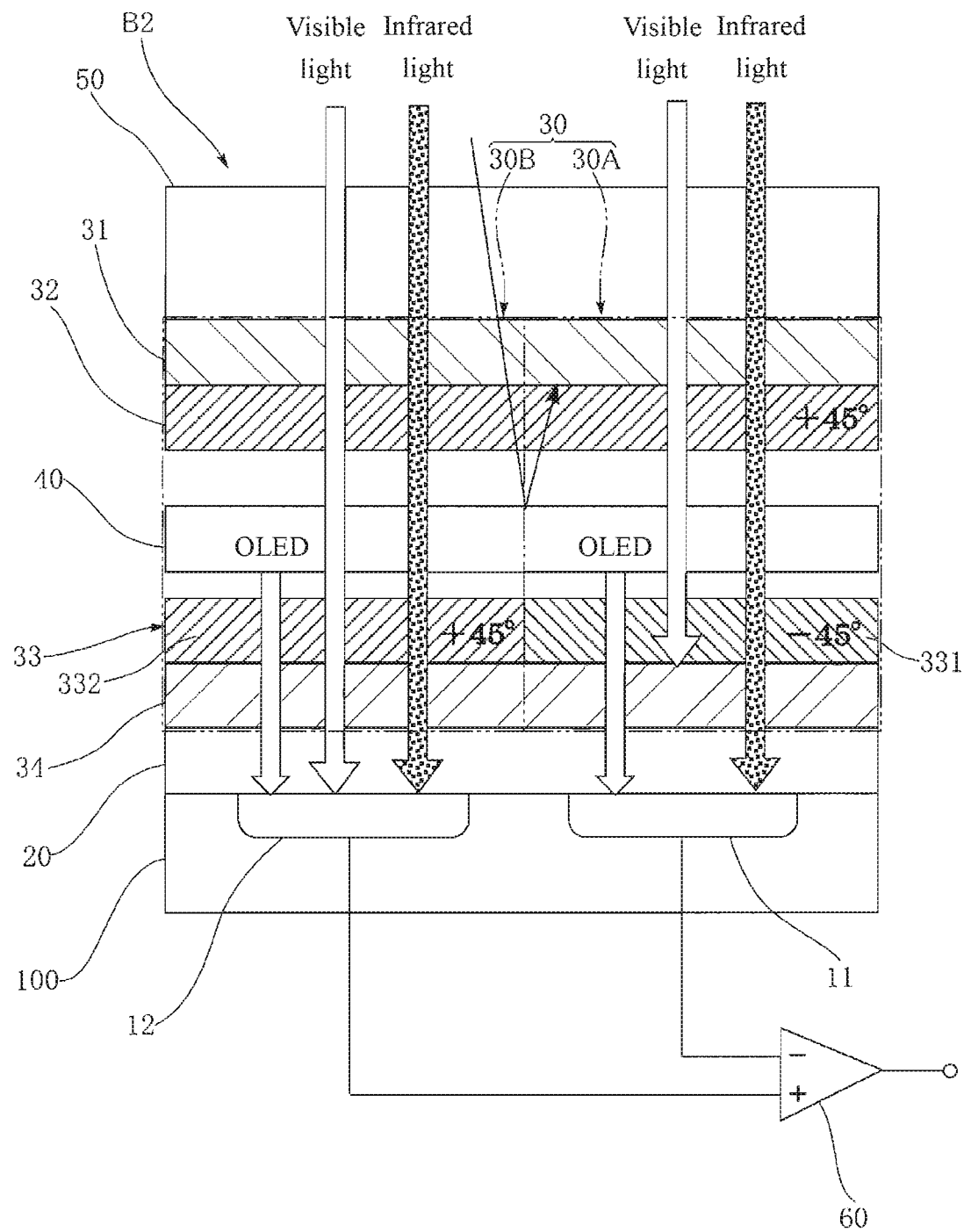
FIG. 13 is a brief configuration diagram of an electronic machine according to the second embodiment of the present invention.

FIG. 13 shows an electronic machine B2 as an electronic machine according to the second embodiment of the present invention. Comparing to the electronic machine B1 in FIG. 12, the electronic machine B2 differs by the relations of the polarization directions of the first linear polarization plate 31 and the second linear polarization plate 34, and the configurations of the first quarter-wave plate 32 and the second quarter-wave plate 33, and the remaining configuration details are the same with those in the electronic machine B1 in FIG. 12. That is to say, in the electronic machine B2 in FIG. 13, the polarization direction (the first polarization direction) of the first linear polarization plate 31 differs from the polarization direction (the second polarization direction) of the second linear polarization plate 34 by 90°. In FIG. 13, such is represented by slant shading lines in different directions. The first quarter-wave plate 32 is set to "+45°" in the entire of the first optical region 30A and the second optical region 30B (the region corresponding to the first receiving portion 11 and the region corresponding to the second light receiving portion 12). Regarding the second quarter-wave plate 33, the first portion 331 in the first optical region 30A is set to "−45°", and the second portion 332 in the second optical region 30B is set to "+45°". That is to say, the slow axis of the first quarter-wave plate 32 has a relation of +45° in regard to the polarization direction (the first polarization) of the first linear polarization plate 32. The slow axis of the first portion 331 of the second quarter-wave plate 33 has a relation of −45° in regard to the first polarization direction. In this embodiment, the polarization direction (the first polarization direction) of the first linear polarization plate 31 differs from the polarization direction (the second polarization direction) of the second linear polarization plate 34 by 90°, and hence the slow axis of the first portion 331 of the second quarter-wave plate 33 has a relation of +45° in regard to the polarization direction (the second polarization direction) of the second linear polarization plate 34. Therefore, the relation of the slow axis of the first portion 331 in regard to the polarization (the second polarization direction) of the second linear polarization plate 34 is the same with the relation of the slow axis of the first quarter-wave plate 32 in regard to the polarization direction (the first polarization direction) of the first linear polarization plate 31, that is, +45°. On the other hand, the slow axis of the second portion 332 of the second quarter-wave plate 33 has a relation of +45° in regard to the polarization direction (the first polarization direction) of the first linear polarization plate 31. The polarization direction (the first polarization direction) of the first linear polarization plate 31 differs from the polarization direction (the second polarization direction) of the second linear polarization direction 34 by 90°, and hence the slow axis of the second portion 332 of the second quarter-wave plate 33 has a relation of −45° in regard to the polarization direction (the second polarization direction) of the second linear polarization plate 34. Therefore, the relation of the slow axis of the first portion 331 in regard to the polarization direction (the second polarization direction) of the second linear polarization plate 34 is −45° that is opposite in sign to the relation of the slow axis of the first quarter-wave plate 32 in regard to the polarization direction (the first polarization direction) of the first linear polarization plate 31.

Next, the functions of the electronic machine B1 shown in FIG. 13 are described individually below, for when the ineffective bands of both the first linear polarization plate 31 and the second linear polarization plate 34 include the infrared band, when the ineffective band of only the first linear polarization plate 31 between the first linear polarization plate 31 and the second linear polarization plate 34 includes the infrared band, and when the ineffective band of only the second linear polarization plate 34 between the first linear polarization plate 31 and the second linear polarization plate 34 includes the infrared band.

[When the Ineffective Bands of Both the First Linear Polarization Plate 31 and the Second Linear Polarization Plate 34 Include the Infrared Band]

In terms of prohibiting or suppressing the light reflected by the electrode of the OLED 40 in the external light (visible light) entering from the optical window 50 from exiting the optical window 50, associated details are the same with the description given for the electronic machine B1 in FIG. 12.

The exiting light from the side of the back surface of the OLED 40 passes through the second quarter-wave plate 33 (the first portion 331) in the first optical region 30A (the region corresponding to the first light receiving portion 11), is polarized by the second linear polarization plate 34 and arrives at the first light receiving portion 11. Similarly for the second optical region 30B (the region corresponding to the second light receiving portion 12), the exiting light from the side of the back surface of the OLED 40 passes through the second quarter-wave plate 33 (the second portion 332), is polarized by the second linear polarization plate 34 and arrives at the second light receiving portion 12.

Neither of the first linear polarization plate 31 and the second linear polarization plate 34 has a polarization function for infrared light, and thus both of the first light receiving portion 11 and the second light receiving portion 12 are capable of receiving infrared light.

On the other hand, regarding visible light, in the first optical region 30A (the region corresponding to the first light receiving portion 11), linearly polarized light passing through the first linear polarization plate 31 becomes circularly polarized light by the first quarter-wave plate 32)(+45°. As described above, the relation of the slow axis of the first portion 331 of the second quarter-wave plate 33 in regard to the polarization direction (the second polarization direction) of the second linear polarization plate 34 is the same with the relation of the slow axis of the first quarter-wave plate 32 in regard to the polarization direction (the first polarization direction) of the first linear polarization plate 31, that is, +45°. Therefore, the circularly polarized light formed by the first linear polarization plate 31 and the first quarter-wave plate 32 is incapable of passing through the second linear polarization plate 34. That is to say, the first light receiving portion 11 does not receive visible light from the exterior, but receives infrared light and light from the OLED 40.

Regarding visible light, in the second optical region 30B (the region corresponding to the second light receiving portion 12), the linearly polarized light passing through the first linear polarization plate 31 becomes circularly polarized light by the first quarter-wave plate)(+45°. As described above, the relation of the slow axis of the second portion 332 of the second quarter-wave plate 33 in regard to the polarization direction (the second polarization direction) of the second linear polarization plate 34 is −45° that is opposite in sign to the relation of the slow axis of the first quarter-wave plate 32 in regard to the polarization direction (the first polarization direction) of the first linear polarization plate 31. Therefore, the circularly polarized light formed by the first linear polarization plate 31 and the first quarter-wave plate 32 is capable of passing through the second linear polarization plate 34 and arriving at the second light receiving portion 12. That is to say, the second light receiving portion 12 receives infrared light, visible light from the exterior, and light from the OLED 40.

The difference detecting portion 60 eliminates the infrared components from the light receiving amounts and the components of light from the OLED 40 of the first light receiving portion 11 and the second light receiving portion 12 by means of obtaining the difference between the two light receiving portions 11 and 12, and outputs the light receiving amount of visible light from the exterior as a signal. Therefore, the electronic machine B1 is capable of eliminating or mitigating undesirable influences such as noise caused by infrared light or light from the OLED 40, and performing illuminance detection.

[When the Ineffective Band of Only the First Linear Polarization Plate 31 Between the First Linear Polarization Plate 31 and the Second Linear Polarization Plate 34 Includes the Infrared Band]

In terms of prohibiting or suppressing the light reflected by the electrode of the OLED 40 in the external light (visible light) entering from the optical window 50 from exiting the optical window 50, associated details are the same with the description given for the electronic machine B1 in FIG. 12.

The exiting light from the side of the back surface of the OLED 40 passes through the second quarter-wave plate 33 (the first portion 331) in the first optical region 30A (the region corresponding to the first light receiving portion 11), is polarized by the second linear polarization plate 34 and arrives at the first light receiving portion 11. Similarly for the second optical region 30B (the region corresponding to the second light receiving portion 12), the exiting light from the side of the back surface of the OLED 40 passes through the second quarter-wave plate 33 (the second portion 332), is polarized by the second linear polarization plate 34 and arrives at the second light receiving portion 12.

Regarding infrared light, in the first optical region 30A (the region corresponding to the first light receiving portion 11), the first linear polarization plate 31 does not have a polarization function, and thus the infrared light directly passes through the first linear polarization plate 31, the first quarter-wave plate 32 and the second quarter-wave plate 33. Infrared light arriving at the second linear polarization plate 34 is polarized by the second linear polarization plate 34, and arrives at the first light receiving portion 11.

Regarding infrared light, in the second optical region 30B (the region corresponding to the second light receiving portion 12), the first linear polarization plate 31 likewise does not have a polarization function, and thus the infrared light directly passes through the first linear polarization plate 31, the first quarter-wave plate 32 and the second quarter-wave plate 33. The infrared light arriving at the second linear polarization plate 34 is polarized by the second linear polarization plate 34, and arrives at the second light receiving portion 12.

Regarding infrared light, the first light receiving portion 11 and the second light receiving portion 12 similarly receive the infrared light.

Regarding visible light, in the first optical region 30A (the region corresponding to the first light receiving portion 11), the linearly polarized light passing through the first linear polarization plate 31 becomes circularly polarized light by the first quarter-wave plate 32)(+45°. As described above, the relation of the slow axis of the first portion 331 of the second quarter-wave plate 33 in regard to the polarization direction (the second polarization direction) of the second linear polarization plate 34 is the same with the relation of the slow axis of the first quarter-wave plate 32 in regard to the polarization direction (the first polarization direction) of the first linear polarization plate 31, that is, +45°. Therefore, the circularly polarized light formed by the first linear polarization plate 31 and the first quarter-wave plate 32 is incapable of passing through the second linear polarization plate 34. That is to say, the first light receiving portion 11 does not receive visible light from the exterior, but receives infrared light and light from the OLED 40.

Regarding visible light, in the second optical region 30B (the region corresponding to the second light receiving portion 12), the linearly polarized light passing through the first linear polarization plate 31 becomes circularly polarized light by the first quarter-wave plate)(+45°. As described above, the relation of the slow axis of the second portion 332 of the second quarter-wave plate 33 in regard to the polarization direction (the second polarization direction) of the second linear polarization plate 34 is −45° that is opposite in sign to the relation of the slow axis of the first quarter-wave plate 32 in regard to the polarization direction (the first polarization direction) of the first linear polarization plate 31. Therefore, the circularly polarized light formed by the first linear polarization plate 31 and the first quarter-wave plate 32 is capable of passing through the second linear polarization plate 34 and arriving at the second light receiving portion 12. That is to say, the second light receiving portion 12 receives infrared light, visible light from the exterior, and light from the OLED 40.

The difference detecting portion 60 eliminates the infrared components from the light receiving amounts and the components of light from the OLED 40 of the first light receiving portion 11 and the second light receiving portion 12 by means of obtaining the difference between the two light receiving portions 11 and 12, and outputs the light receiving amount of visible light from the exterior as a signal. Therefore, the electronic machine B1 is capable of eliminating or mitigating undesirable influences such as noise caused by infrared light or light from the OLED 40, and performing illuminance detection.

[When the Ineffective Band of Only the Second Linear Polarization Plate 34 Between the First Linear Polarization Plate 31 and the Second Linear Polarization Plate 31 Includes the Infrared Band]

In terms of prohibiting or suppressing the light reflected by the electrode of the OLED 40 in the external light (visible light) entering from the optical window 50 from exiting the optical window 50, associated details are the same with the description given for the electronic machine B1 in FIG. 12.

The exiting light from the side of the back surface of the OLED 40 passes through the second quarter-wave plate 33 (the first portion 331) in the first optical region 30A (the region corresponding to the first light receiving portion 11), is polarized by the second linear polarization plate 34 and arrives at the first light receiving portion 11. Similarly for the second optical region 30B (the region corresponding to the second light receiving portion 12), the exiting light from the side of the back surface of the OLED 40 passes through the second quarter-wave plate 33 (the second portion 332), is polarized by the second linear polarization plate 34 and arrives at the second light receiving portion 12.

Regarding infrared light, in the first optical region 30A (the region corresponding to the first light receiving portion 11), the infrared light is polarized at the first linear polarization plate 31, and arrives at the second linear polarization plate 34 in a manner that the polarization direction thereof is not changed at timings of passing through the first quarter-wave plate 32 and the second quarter-wave plate 33 (the first portion 331). The second polarization plate 34 does not have a polarization function for infrared light, and thus polarized light generated by the first linear polarization plate 31 directly arrives at the first light receiving portion 11.

Regarding infrared light, in the second optical region 30B (the region corresponding to the second light receiving portion 12), the infrared light is polarized at the first linear polarization plate 31, and the polarization direction thereof changes by 90° at timings in a period of passing through the first quarter-wave plate 32 and the second quarter-wave plate 33 (the second portion 332). The second polarization plate 34 does not have a polarization function for infrared light, and thus the foregoing polarized light changed by 90° directly arrives at the second light receiving portion 12.

That is to say, regarding infrared light, the first light receiving portion 11 and the second light receiving portion 12 receive the infrared light by the same light amount for polarized light of a phase difference of 90°.

Regarding visible light, in the first optical region 30A (the region corresponding to the first light receiving portion 11), the linearly polarized light passing through the first linear polarization plate 31 becomes circularly polarized light by the first quarter-wave plate 32)(+45°. As described above, the relation of the slow axis of the first portion 331 of the second quarter-wave plate 33 in regard to the polarization direction (the second polarization direction) of the second linear polarization plate 34 is the same with the relation of the slow axis of the first quarter-wave plate 32 in regard to the polarization direction (the first polarization direction) of the first linear polarization plate 31, that is, +45°. Therefore, the circularly polarized light formed by the first linear polarization plate 31 and the first quarter-wave plate 32 is incapable of passing through the second linear polarization plate 34. That is to say, the first light receiving portion 11 does not receive visible light from the exterior, but receives infrared light and light from the OLED 40.

Regarding visible light, in the second optical region 30B (the region corresponding to the second light receiving portion 12), the linearly polarized light passing through the first linear polarization plate 31 becomes circularly polarized light by the first quarter-wave plate)(+45°. As described above, the relation of the slow axis of the second portion 332 of the second quarter-wave plate 33 in regard to the polarization direction (the second polarization direction) of the second linear polarization plate 34 is −45° that is opposite in sign to the relation of the slow axis of the first quarter-wave plate 32 in regard to the polarization direction (the first polarization direction) of the first linear polarization plate 31. Therefore, the circularly polarized light formed by the first linear polarization plate 31 and the first quarter-wave plate 32 is capable of passing through the second linear polarization plate 34 and arriving at the second light receiving portion 12. That is to say, the second light receiving portion 12 receives infrared light, visible light from the exterior, and light from the OLED 40.

The difference detecting portion 60 eliminates the infrared components from the light receiving amounts and the components of light from the OLED 40 of the first light receiving portion 11 and the second light receiving portion 12 by means of obtaining the difference between the two light receiving portions 11 and 12, and outputs the light receiving amount of visible light from the exterior as a signal. Therefore, the electronic machine B1 is capable of eliminating or mitigating undesirable influences such as noise caused by infrared light or light from the OLED 40, and performing illuminance detection.

Further, in the electronic machines B1 and B2, the configurations of the first light receiving portion 11, the second light receiving portion 12, the color filter layer 20, the first optical region 30A and the second optical region 30B may be implemented by the configurations of any of the illuminance sensors A5 to A8 described with reference to FIG. 5 to FIG. 10. In this case, the illuminance sensors A5 to A8 produce the same effects as above.

It should be noted that, the scope of the present invention is not limited to the embodiments described, and all variations made within the scope of the items stated in the claims are to be encompassed within the scope of the invention.

For example, regarding the first quarter-wave plate 32 and the second quarter-wave plate 33, a wave plate having a function indicated as "+45°" may be modified to a wave plate having a function indicated as "−45°", and a wave plate having a function indicated as "−45°" may be modified to a wave plate having a function indicated as "+45°".

Further, in FIG. 1, FIG. 2 and FIG. 12, examples in which the polarization direction (the first polarization direction) of the first linear polarization plate 31 is the same with the polarization direction (the second polarization direction) of the second linear polarization plate 34 are described; in FIG. 3, FIG. 4 and FIG. 14, examples in which the polarization direction (the first polarization direction) of the first linear polarization plate 31 differs from the polarization direction (the second polarization direction) of the second linear polarization plate 34 by 90° are described. However, the relations of the first polarization direction of the first linear polarization plate 31 and the second polarization direction of the second linear polarization plate 34 are not limited to these examples. That is to say, given that the relation of the slow axis of the first quarter-wave plate 32 in regard to the first polarization plate direction and the relation of the slow axis of the second quarter-wave plate 33 in regard to the second polarization plate direction satisfy the relations specified above, any phase difference between the first polarization direction of the first linear polarization plate 31 and the second polarization direction of the second linear polarization plate 34 may be applied.

The present invention includes the configurations associated with the addenda below.

[Addendum 1]

An illuminance sensor, including:
  a first light receiving portion and a second light receiving portion;
  a first optical region and a second optical region, disposed corresponding to the first light receiving portion and the second light receiving portion, respectively;
  a difference detecting portion, obtaining a difference between outputs of the first light receiving portion and the second light receiving portion;
  wherein, the first optical region and the second optical region comprise a first linear polarization plate, a first quarter-wave plate, a second quarter-wave plate and a second linear polarization plate corresponding to both the first light receiving portion and the second light receiving portion, and disposed sequentially in an order that the first linear polarization plate is farthest from the first light receiving portion and the second light receiving portion,
  an ineffective band of either one or both of the first and second linear polarization plates comprises a least a portion of an infrared band,
  a slow axis of the first quarter-wave plate comprises a relation of +45° or −45° in regard to a first polarization direction that is a polarization direction of the first linear polarization plate,
  the second quarter-wave plate comprises a first portion and a second portion, wherein the first portion is in the first optical region and the second portion is in the second optical region,
  a slow axis of the first portion comprises a relation of +45° or −45° in regard to a second polarization direction that is a polarization direction of the second linear polarization plate, wherein the relation of the slow axis of the first portion in regard to the second polarization direction is the same with the relation of the slow axis of the first quarter plate in regard to the first polarization direction, and
  a relation of a slow axis of the second portion in regard to the second polarization direction is −45° or +45° that is opposite in sign to the relation of the slow axis of the first quarter plate in regard to the first polarization direction.

[Addendum 2]

An illuminance sensor, including:
  a first light receiving portion and a second light receiving portion;
  a first optical region and a second optical region, disposed corresponding to the first light receiving portion and the second light receiving portion, respectively;
  a difference detecting portion, obtaining a difference between outputs of the first light receiving portion and the second light receiving portion;
  wherein, the first optical region and the second optical region comprise a first linear polarization plate, a first quarter-wave plate, a second quarter-wave plate and a second linear polarization plate corresponding to both the first light receiving portion and the second light receiving portion, and disposed sequentially in an order that the first linear polarization plate is farthest from the first light receiving portion and the second light receiving portion, an ineffective band of either one or both of the first and second linear polarization plates comprises a least a portion of an infrared band, the first quarter-wave plate comprises a first portion and a second portion, wherein the first portion is in the first optical region and the second portion is in the second optical region, a slow axis of the first portion comprises a relation of +45° or −45° in regard to a first polarization direction that is a polarization direction of the first linear polarization plate, a relation of a slow axis of the second portion in regard to the first polarization direction is −45° or +45° that is opposite in sign to the relation of the slow axis of the first portion in regard to the first polarization direction, and a slow axis of the second quarter-wave plate comprises a relation of +45° or −45° in regard to a second polarization direction that is a polarization direction of the second linear polarization plate, wherein the relation of the slow axis of the second quarter-wave plate in regard to the second polarization direction is the same with the relation of the slow axis of the first portion in regard to the first polarization direction.

[Addendum 3]
The illuminance sensor according to addendum 1 or 2, wherein the first light receiving portion and the second light receiving portion are manufactured and incorporated into the same integrated circuit (IC).

[Addendum 4]
The illuminance sensor according to any one of addenda 1 to 3, including a color filter layer interposed between the first light receiving portion and the second light receiving portion and the second linear polarization plate.

[Addendum 5]
The illuminance sensor according to addendum 4, wherein:
the color filter layer includes a first filter portion corresponding to the first light receiving portion, and a second filter portion corresponding to the second light receiving portion,
the first light receiving portion and the second light receiving portion comprise a plurality of light receiving elements, respectively,
the plurality of light receiving elements comprise a first light receiving element, a second light receiving element and a third light receiving element,
the first filter portion and the second filter portion comprise: a first red filter and a second red filter, covering the first light receiving element so that blue light and green light are selectively attenuated; a first green filter and a second green filter, covering the second light receiving element so that red light and the blue light are selectively attenuated; and a first blue filter and a second blue filter, covering the third light receiving element so that the red light and the green light are selectively attenuated.

[Addendum 6]
The illuminance sensor according to addendum 5, wherein:
the first optical region and the second optical region, the first filter portion and the second filter portion of the color filter layer, and the first light receiving portion and the second light receiving portion are alternately arranged in a matrix in a first direction and a second direction orthogonal to each other, respectively; and
in the first filter portion and the second filter portion that are adjacent, the first red filter, the first green filter and the first blue filter are disposed adjacent to the second red filter, the second green filter and the second blue filter in at least any one of the first direction and the second direction.

[Addendum 7]
The illuminance sensor according to addendum 6, wherein:
in a filter disposing region formed by disposing a plurality of first filter portions and a plurality of second filter portions, all the first red filters and the second red filters, all the first green filters and second green filters, and all the first blue filters and second blue filters are disposed as being dot symmetric relative to the center of the filter disposing region as a center of symmetry.

[Addendum 8]
The illuminance sensor according to any one of addenda 1 to 3, wherein:
the first light receiving portion and the second light receiving portion include a plurality of light receiving elements, respectively; and
the plurality of light receiving elements include a light receiving element for visible light having a sensing peak in a visible band, and a light receiving element for infrared light having a sensing peak in an infrared band.

[Addendum 9]
The illuminance sensor according to addendum 8, wherein:
the first optical region and the second optical region, and the first light receiving portion and the second light receiving portion are alternately arranged in a matrix in a first direction and a second direction orthogonal to each other, respectively; and
in the first light receiving portion and the second light receiving portion adjacent to each other, the light receiving element for visible light and the light receiving element for infrared light of the first light receiving portion are disposed adjacently in at least any one of the first direction and the second direction, respectively.

[Addendum 10]
The illuminance sensor according to addendum 9, wherein:
all the light receiving elements for visible light and all the light receiving elements for infrared light are disposed as being dot symmetric relative to a center of a light receiving portion disposing region as a center of symmetry, and the light receiving portion disposing region is formed by a plurality of first light receiving portions and a plurality of second light receiving portions in a matrix.

[Addendum 11]
An electronic machine, including the illuminance sensor of any one of the addenda 1 to 10.

[Addendum 12]
A two-dimensional (2D) image sensor, disposed with a plurality of the illuminance sensor according to any one of addenda 1 to 5 and 8 in a same plane.

[Addendum 13]
The 2D image sensor according to addendum 12, wherein the illuminance sensor is disposed in a plurality of rows and a plurality of columns.

[Addendum 14]
An electronic machine, including:
the illuminance sensor according to any one of addenda 1 to 10; and
an organic light-emitting diode (OLED), disposed between the first quarter-wave plate and the second quarter-wave plate, having a display surface thereof facing the side of the first quarter-wave plate;
wherein, the first light receiving portion and the second light receiving portion are disposed in a plane parallel to the OLED on a side of a back surface of the OLED.

Details and technical contents of the present invention are given with the accompanying drawings below. It should be noted that the accompanying drawings are for illustration purposes and are not to be construed as limitations to the present invention.

What is claimed is:

1. An illuminance sensor, comprising:
a first light receiving portion and a second light receiving portion;
a first optical region and a second optical region, disposed corresponding to the first light receiving portion and the second light receiving portion respectively; and
a difference detecting portion, obtaining a difference between outputs of the first light receiving portion and the second light receiving portion,
wherein the first optical region and the second optical region comprise a first linear polarization plate, a first quarter-wave plate, a second quarter-wave plate and a second linear polarization plate corresponding to both the first light receiving portion and the second light receiving portion, and disposed sequentially in an order that the first linear polarization plate is farthest from the first light receiving portion and the second light receiving portion,
an ineffective band of either one or both of the first and second linear polarization plates comprises at least a portion of an infrared band,
the first quarter-wave plate comprises a first portion and a second portion, wherein the first portion is in the first optical region and the second portion is in the second optical region,
a slow axis of the first portion comprises a relation of +45° or −45° in regard to a first polarization direction that is a polarization direction of the first linear polarization plate,
a relation of a slow axis of the second portion in regard to the first polarization direction is −45° or +45° that is opposite in sign to the relation of the slow axis of the first portion in regard to the first polarization direction, and
a slow axis of the second quarter-wave plate comprises a relation of +45° or −45° in regard to a second polarization direction that is a polarization direction of the second linear polarization plate, wherein the relation of the slow axis of the second quarter-wave plate in regard to the second polarization direction is the same with the relation of the slow axis of the first portion in regard to the first polarization direction.

2. The illuminance sensor according to claim 1, wherein the first light receiving portion and the second light receiving portion are manufactured and incorporated in a same integrated circuit.

3. The illuminance sensor according to claim 1, comprising:
a color filter layer, disposed between the first light receiving portion and the second light receiving portion and the second linear polarization plate.

4. The illuminance sensor according to claim 1, wherein
the first light receiving portion and the second light receiving portion comprise a plurality of light receiving elements, respectively; and
the plurality of light receiving elements comprise a light receiving element for visible light having a sensing peak in a visible band, and a light receiving element for infrared light having a sensing peak in an infrared band.

5. An electronic machine, comprising the illuminance sensor according to claim 1.

6. A two-dimensional (2D) image sensor, disposed with a plurality of the illuminance sensors according to claim 1 in a same plane.

7. An electronic machine, comprising:
the illuminance sensor according to claim 1; and
an organic light-emitting diode (OLED), disposed between the first quarter-wave plate and the second quarter-wave plate, with a display surface thereof facing a side of the first quarter-wave plate,
wherein the first light receiving portion and the second light receiving portion are disposed in a plane parallel to the OLED on a side of a back surface of the OLED.

* * * * *